(12) United States Patent
Park et al.

(10) Patent No.: US 10,700,656 B2
(45) Date of Patent: Jun. 30, 2020

(54) WIDEBAND VARIABLE GAIN AMPLIFIER WITH LOW PHASE VARIATION

(71) Applicant: Korea Advanced Institute of Science and Technology, Daejeon (KR)

(72) Inventors: ChulSoon Park, Daejeon (KR); SeungHun Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 15 days.

(21) Appl. No.: 16/215,864

(22) Filed: Dec. 11, 2018

(65) Prior Publication Data

US 2020/0144978 A1 May 7, 2020

(30) Foreign Application Priority Data

Nov. 7, 2018 (KR) .................. 10-2018-0136013

(51) Int. Cl.
*H03F 1/22* (2006.01)
*H03G 3/30* (2006.01)
(Continued)

(52) U.S. Cl.
CPC ............. *H03G 3/30* (2013.01); *H03F 1/0205* (2013.01); *H03F 1/56* (2013.01); *H03F 3/04* (2013.01);
(Continued)

(58) Field of Classification Search
CPC ........................................................ H03F 1/22
(Continued)

(56) References Cited

U.S. PATENT DOCUMENTS 6,628,170 B2 * 9/2003 Titus .................. H03F 1/22
330/278
10,439,577 B2 * 10/2019 Tsai .................. H03G 1/0029
(Continued)

OTHER PUBLICATIONS

Kao et al., "A 60 GHz Variable-Gain Low-Noise Amplifier with Low Phase Variation;" 2016 IEEE International Symposium on Radio-Frequency Integration Technology (RFIT); Aug. 2016; 3 Pages.
(Continued)

*Primary Examiner* — Henry Choe
(74) *Attorney, Agent, or Firm* — Daly Crowley Mofford & Durkee, LLP

(57) ABSTRACT

A wideband variable gain amplifier (VGA) having a low phase change is disclosed. The first VGA amplifies an input signal by a current steering manner so that an amplification gain is variable. The larger a variable gain amount of the first output signal amplified by the first VGA is, the more a relative phase change amount gradually increases in either positive direction or negative direction. The second VGA further amplifies the first amplified output signal in the current steering manner so as to vary the amplification gain. As a variable gain amount of a second output signal amplified by the second VGA becomes larger, a relative phase change amount gradually increases in a direction opposite to the phase change direction of the first VGA. This opposing phase changes of the first and second VGAs are canceled against each other to provide a variable amplification gain over the wideband frequency range with a low phase change.

20 Claims, 11 Drawing Sheets

(51) Int. Cl.
*H03F 1/02* (2006.01)
*H03F 3/04* (2006.01)
*H03F 1/56* (2006.01)

(52) U.S. Cl.
CPC .... *H03F 2200/222* (2013.01); *H03F 2200/36* (2013.01); *H03F 2200/387* (2013.01); *H03G 2201/103* (2013.01); *H03G 2201/70* (2013.01)

(58) Field of Classification Search
USPC .................................................. 330/311, 310
See application file for complete search history.

(56) References Cited

U.S. PATENT DOCUMENTS

| 2001/0020871 A1* | 9/2001 | Titus | H03F 1/22 330/278 |
| 2010/0226450 A1* | 9/2010 | Tanaka | H04B 1/71637 375/260 |

OTHER PUBLICATIONS

Wang et al., "A 60 GHz Low Noise Variable Gain Amplifier with Small Noise Figure and IIP3 Variation in a 40-nm CMOS Technology;" 2018 IEEE MTT-S International Wireless Symposium (IWS); May 2018; 4 Pages.

Chia-Yu Hsieh et al., "A 57-64 GHz Low-phase-variation Variable-gain Amplifier;" IEEE/MTT-S International Microwave Symposium Digest; Jun. 2012; 3 Pages.

Youngmin Kim et al., "A 60 GHz Cascode Variable-Gain Low-Noise Amplifier With Phase Compensation in a 0.13 μm CMOS Technology;" IEEE Microwave and Wireless Components Letters, vol. 22, No. 7; Jul. 2012; 3 Pages.

Di-Sheng Siao et al., "A 60 GHz Low Phase Variation Variable Gain Amplifier in 65 nm CMOS;" IEEE Microwave and Wireless Components Letters, vol. 24, No. 7; Jul. 2014; 3 Pages.

Han-Chih Yeh et al., "A Wide Gain Control Range V-Band CMOS Variable-Gain Amplifier With Built-In Linearizer;" IEEE Transactions on Microwave Theory and Techniques, vol. 61, No. 2; Feb. 2013; 12 Pages.

* cited by examiner (A)

(B)

(A)

(B)

(B)

(A)

WIDEBAND VARIABLE GAIN AMPLIFIER WITH LOW PHASE VARIATION

CROSS-REFERENCE TO RELATED APPLICATION

This U.S. non-provisional application claims priority under 35 USC § 119 from Korean Patent Application No. 10-2018-0136013, filed on Nov. 7, 2018 in the Korean Intellectual Property Office (KIPO), the disclosure of which is hereby incorporated by reference in its entirety.

BACKGROUND

1. Technical Field

The present invention relates to a field of variable gain amplifier (VGA), and more particularly to a wideband VGA often used in wireless communication systems.

2. Description of the Related Art

The VGA is one of the components frequently used in electronic systems or wireless communication systems, such as audio level compressors, synthesizers, amplitude modulators, automatic level control loops and phased array systems.

A current steering type VGA has been known. The VGA of a current steering structure has an advantage that an input/output impedance is changed little by controlling a gain through bias control. Because of this, the VGA with the current steering structure is widely used. However, the current steering structured VGA has a drawback that the phase change also increases sharply as the variable gain becomes larger.

One of the important parameters for the VGA is an associated phase change during gain control. For example, in a phased array system and a vector sum modulator, it is required that a constant phase should be maintained during a gain control. There may be problems that the power consumption should be increased or loss of amplification gain should be taken to minimize the phase change. These problems should be solved in the design of the VGA. However, the conventional VGAs can achieve low phase variations only with high direct current (DC) power consumption or in a small gain control range.

The VGA may be also required to have a wide gain control range. However, the existing VGAs can provide a wide gain control range, but they also have a limitation in not having a mechanism to minimize the phase variation.

SUMMARY

The present invention has been made in view of the above-described problems of the prior arts. The present invention is to provide a VGA having a small phase change even in a wide frequency band by combining a current steering VGA structure and a current steering VGA using a degenerate inductor so as to cancel out a phase change between them.

The present invention is not limited to the above-described object, and various modifications can be made without departing from the spirit and scope of the invention.

The wideband VGA according to embodiments of the present invention includes a first VGA and a second VGA. The first VGA amplifies an input signal in a current steering manner to be output with a variable gain amount such that a relative phase change amount gradually increases in any one of a positive direction and a negative direction as a variable gain amount of a first amplified output signal from the first VGA becomes larger. The second VGA has an input terminal connected to an output terminal of the first variable gain amplification unit, and further amplifies the first amplified output signal received from the first VGA in the current steering manner with a variable amplification gain so that a relative phase change amount gradually increases in a direction opposite to a phase change direction by the first VGA as a variable gain amount of a second amplified output signal from the second VGA becomes larger. A variable amplification gain for the input signal is provided over a wide frequency range with a low phase change as a phase difference between the first VGA and the second VGA is canceled.

In exemplary embodiments, the second VGA may be configured to include a phase adjustment unit that is configured to adjust a phase change amount of the output signal from the second VGA by using a degeneracy inductor such that a relative phase change amount gradually increases in a positive direction as a variable gain amount increases.

In exemplary embodiments, the first VGA may include at least first and second variable gain transistors for controlling an amplification operation through current steering, and the second VGA includes at least third and fourth variable gain transistors for controlling an amplification operation through current steering. The first and third variable gain transistors may be configured to receive a common first control bias voltage, and the second and fourth variable gain transistors are configured to receive a common second control bias voltage, so that the first VGA and the second VGA perform amplification operations to simultaneously produce variable gains by varying at least one of the first control bias voltage and the second control bias voltage.

In the exemplary embodiments, the variable gain obtained by in each of the first VGA and the second VGA is changed digitally instead of being changed analogously by setting each of the first control bias voltage and the second control bias voltage to any one of a voltage corresponding to ON and a voltage corresponding to OFF.

In exemplary embodiments, the first VGA may include a first two-stage variable amplification unit, a first input unit, a first bias voltage input unit, a first current steering variable gain amplification unit, and a first output unit. The first two-stage variable amplification unit may be configured to be a cascade amplifier formed with first and second transistors, and to multi-stage amplify an input signal of the first VGA to be output so that a variable amplification gain is obtained by current steering control. The first input unit may be configured to provide a bias voltage and an impedance-matched input signal of the first VGA to the first transistor located at an input terminal of the first two-stage variable amplification unit. The first bias voltage input unit may be connected between Vdd and ground and configured to provide a bias voltage from which an AC component is removed to the second transistor located at an output terminal of the first two-stage variable amplification unit. The first current steering variable gain amplification unit may be connected to a connection node between the first transistor and the second transistor, and configured to vary an amplification gain of the first two-stage amplification unit by current steering. The first output unit may be connected between Vdd and an output terminal of the first two-stage variable amplification unit, and configured to output an output signal amplified by the first two-stage variable amplification unit so as to block a direct current component and ensure impedance matching and gain characteristics.

In exemplary embodiments, the first two-stage variable amplification unit may include a first field effect transistor functioning as a common-source (CS) amplifier; a second field effect transistor functioning as a common-gate (CG) amplifier and coupled with the first field effect transistor to form a cascode amplifier; and a third inductor, connected between a drain, which is an output terminal, of the first field effect transistor and a source, which is an input terminal, of the second field effect transistor, and being operable to secure a wideband cascode bandwidth. The first input unit may include a first capacitor connected to an input terminal of the first VGA and blocking a direct current component included in an input signal applied to the first two-stage variable amplification unit; first and second inductors, coupled between an input of the first VGA and ground and between the first capacitor and the gate of the first field effect transistor, respectively, and providing a conjugate input and output impedance match; and a first resistor connected between the second inductor and a connection node between a gate of the first field effect transistor and ground, and supplying a gate bias voltage to the first field effect transistor. The first bias voltage input unit may include a second resistor connected between Vdd and a CG of the second field effect transistor to supply a gate bias voltage; and a second capacitor, connected between ground and a connection node between the second resistor and the CG of the second field effect transistor, and to short an AC component included in a gate bias voltage of the second field effect transistor to be grounded. The first current steering variable gain amplification unit may include a third resistor connected to a first bias control voltage for a digital control bias input; a fourth resistor connected to a second bias control voltage for a digital control bias input; a third field effect transistor having a source connected to a source of the second field effect transistor and a gate connected to the third resistor; and a fourth field effect transistor having a source connected to a source of the second field effect transistor and a gate connected to the fourth resistor. The first output unit may include fourth and fifth inductors, connected in series between Vdd and a drain, which is an output terminal of the first two-stage variable amplification unit, of the second field effect transistor, and providing impedance matching and ensuring gain characteristics, and a third capacitor, connected between a connection node of the fourth inductor and the fifth inductor and an output terminal of the first VGA, and blocking a direct current component.

In exemplary embodiments, the second VGA may include a second two-stage variable amplification unit, a second input unit, a second bias voltage input unit, a second current steering variable gain amplification unit, a second output unit, and a phase adjustment unit. The second two-stage variable amplification unit may include third and fourth transistors coupled to constitute a cascode amplifier, and be configured to two-state amplify an output signal received from the first VGA such that a variable amplification gain is obtained by current steering. The second input unit may be configured to provide a bias voltage and an impedance matched input signal of the second VGA to the third transistor located at an input terminal of the second two-stage variable amplification unit. The second bias voltage input unit may be connected between Vdd and ground, and configured to provide a bias voltage from which an alternating current component is removed to the fourth transistor located at an output terminal of the second two-stage variable amplification unit. The second current steering variable gain amplification unit may be connected to a connection node between the first transistor and the second transistor, and configured to vary an amplification gain of the second two-stage amplification unit by current steering. The second output unit may be connected between Vdd and an output terminal of the second two-stage variable amplification unit, and configured to output an output signal amplified by the second two-stage variable amplification unit such that a direct component is blocked and impedance matching and gain characteristic are ensured. The phase adjustment unit may be configured to adjust a phase change amount of the output signal of the second VGA using a degeneracy inductor so that a relative phase change amount gradually increases in a positive direction as a variable gain amount of the second two-stage variable amplification unit increases.

In exemplary embodiments, the second two-stage variable amplification unit may include a fifth field effect transistor functioning as a CS amplifier; and a sixth field effect transistor functioning as a CG amplifier and coupled with the fifth field effect transistor to form a cascode amplifier. The second input unit may include a fourth capacitor, connected to an input terminal of the second VGA, and blocking a direct current component included in an input signal applied to the second two-stage variable amplification unit; sixth and seventh inductors, coupled between an output terminal of the first VGA and the ground and between the fourth capacitor and a gate of the fifth field effect transistor, respectively, and providing conjugate input/output impedance matching; and a fifth resistor connected between ground and a connection node of the seventh inductor and a gate of the fifth field effect transistor, and supplying a gate bias voltage to the fifth field effect transistor. The second bias voltage input unit may include a sixth resistor connected between Vdd and a CG of the sixth field effect transistor and supplying a gate bias voltage; and a fifth capacitor, connected between ground and a connection node of the sixth resistor and the CG of the sixth field effect transistor, and shorting an alternating current component included in the gate bias voltage for the sixth field effect transistor to ground. The second current steering variable gain amplification unit may include a seventh resistor, coupled to a first bias control voltage, for a digital control bias input; an eighth resistor, coupled to a second bias control voltage, for a digital control bias input; a seventh field effect transistor having a source connected to a source of the sixth field effect transistor and a gate connected to the seventh resistor; and an eighth field effect transistor having a source connected to a source of the fifth field effect transistor and a gate connected to the eighth resistor. The second output unit may include ninth and tenth inductors, connected in series between Vdd and a drain of the sixth field effect transistor, which is an output terminal of the second two-stage variable amplification unit, and securing impedance matching and gain characteristics; and a sixth capacitor, connected between a connection node of the ninth inductor and the tenth inductor and an output terminal of the second VGA, and blocking a direct current component. The phase adjustment unit may include a degeneracy inductor for adjusting a phase change amount of an output signal of the second VGA; and a seventh capacitor for blocking direct current shorting caused by the degeneracy inductor.

In exemplary embodiments, the wideband variable gain amplification device may further include an input stage impedance matching amplifier, added to a front end of the first VGA, and reinforcing an insufficient gain by pre-amplifying an input of the first VGA and providing impedance matching between an input terminal and an output terminal of the variable gain amplification device.

In exemplary embodiments, the wideband VGA device may further include an output stage impedance matching amplifier, added to a rear end of the second VGA, and reinforcing an insufficient gain by re-amplifying a two-stage amplified output obtained from the second VGA, providing impedance matching between an input terminal and an output terminal of the variable gain amplification device, and enhancing linearity of an output voltage.

In exemplary embodiments, the first VGA performs amplification so that a relative phase change amount gradually increases in a negative direction as a variable gain amount of the first output signal becomes larger, and the second VGA performs amplification so that a relative phase change amount gradually increases in a positive direction as a variable gain amount of the second output signal becomes larger.

Meanwhile, a wideband variable gain amplification device according to other exemplary embodiments to achieve the object of the present invention includes a first VGA, a second VGA, an input stage impedance matching amplifier, and an output stage impedance matching amplifier. The first VGA is configured to amplify an input signal in a current steering manner to be output with a variable gain amount such that a relative phase change amount gradually increases in any one of a positive direction and a negative direction as a variable gain amount of a first amplified output signal from the first VGA becomes larger. The second VGA is configured to have an input terminal connected to an output terminal of the first variable gain amplification unit, and further amplifies the first amplified output signal received from the first VGA in the current steering manner with a variable amplification gain so that a relative phase change amount gradually increases in a direction opposite to a phase change direction by the first VGA as a variable gain amount of a second amplified output signal from the second VGA becomes larger, while adjusting a phase change amount by using a degeneracy inductor. The input stage impedance matching amplifier is added to a front end of the first VGA, and reinforces an insufficient gain by pre-amplifying an input of the first VGA and provides impedance matching between an input terminal and an output terminal of the variable gain amplification device. The output stage impedance matching amplifier is added to a rear end of the second VGA, and reinforces an insufficient gain by re-amplifying a two-stage amplified output obtained from the second VGA, and provides impedance matching between an input terminal and an output terminal of the variable gain amplification device, and enhances linearity of an output voltage. A variable amplification gain for the input signal is provided over a wide frequency range with a low phase change as a phase difference between the first VGA and the second VGA is canceled.

A wideband variable gain amplification device according to still another exemplary embodiments to achieve the object of the present invention includes a first VGA and a second VGA. The first VGA is configured to amplify an input signal in a current steering manner to be output with a variable gain amount such that a relative phase change amount gradually increases in any one of a positive direction and a negative direction as a variable gain amount of a first amplified output signal from the first VGA becomes larger. The second VGA is configured to have an input terminal connected to an output terminal of the first variable gain amplification unit, and further amplifies the first amplified output signal received from the first VGA in the current steering manner with a variable amplification gain so that a relative phase change amount gradually increases in a direction opposite to a phase change direction by the first VGA as a variable gain amount of a second amplified output signal from the second VGA becomes larger. The first VGA performs amplification so that a relative phase change amount gradually increases in a negative direction as a variable gain amount of the first output signal becomes larger, and the second VGA performs amplification so that a relative phase change amount gradually increases in a positive direction as a variable gain amount of the second output signal becomes larger. The second VGA is configured to include a phase adjustment unit that is configured to adjust a phase change amount of the output signal from the second VGA by using a degeneracy inductor such that a relative phase change amount gradually increases in a positive direction as a variable gain amount increases. A variable amplification gain for the input signal is provided over a wide frequency range with a low phase change as a phase difference between the first VGA and the second VGA is canceled.

According to exemplary embodiments of the present invention, a VGA having a characteristic of negative phase change and a VGA having a characteristic of positive phase change are cascade connected so that the phase change amounts of the two VGAs can be offset against each other. As a result, the phase change can be significantly reduced as compared with the conventional VGAs. By adding a degeneracy inductor, a cascode amplification gain can be obtained in a wide frequency band.

By adding the impedance matching amplifiers to the input/output stages, it is possible to reduce the impedance matching change at the input and output stages even in the wideband amplification, to enhance the amplification gain, and to improve the linearity of the amplified final output.

The wideband VGA device according to exemplary embodiments of the present invention can obtain operating characteristics that can uniformly have a low phase change over a wide frequency range. Therefore, it is considered that the wideband VGA device can be used in a variety of fields of designing a high-speed wireless communication system.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
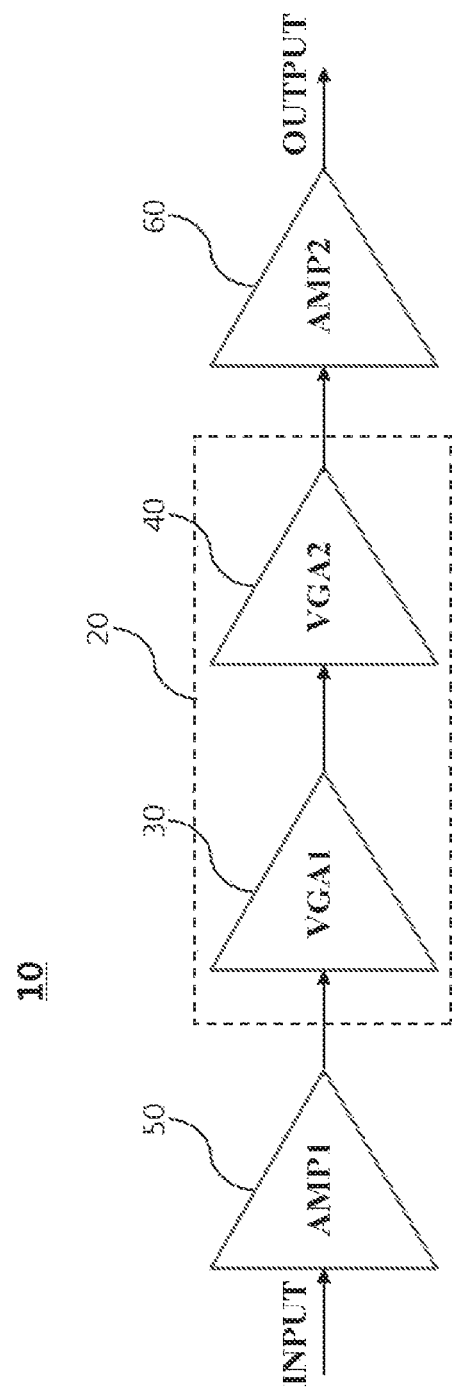
FIG. 1 is a block diagram of a wideband VGA according to an exemplary embodiment of the present invention.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a block diagram of a wideband VGA 10 having a low phase change according to an embodiment of the present invention.

With reference to FIG. 1, the wideband VGA 10 may include a variable gain two-stage amplifier 20 which includes a first VGA 30 and a second VGA 40. The output terminal of the first VGA 30 is connected to the input terminal of the second VGA 40. So, an input signal of the wideband VGA 10 can be two-stage-amplified as a whole by amplifying the input signal through the first VGA 30 and then further amplifying the first amplified signal from the first VGA 30 through the second VGA 40.

The first VGA 30 may be a VGA having a general current steering structure capable of variably controlling the gain through current adjustment to the cascode amplifier. The first VGA 30 may amplify the input signal by the current steering method so that its amplification gain is variable, and output the amplified signal. Basically, the first VGA 30 can perform the amplifying operation such that a relative phase change amount gradually increases in the negative direction as a variable gain amount of the amplified first output signal becomes larger.

Having receiving the amplified first output signal from the first VGA 30, the second VGA 40 further amplifies the amplified first output signal by a cascode amplifier. In the amplification of the amplified first output signal by the second VGA 40, the amplification gain is variably controlled by the current steering method. The second VGA 40 can perform the amplification operation such that the relative phase change amount gradually increases in the positive direction as the variable gain amount of the amplified second output signal becomes larger. The second VGA 40 may be a VGA of a degeneracy inductor current steering structure. By the degeneracy inductor current steering structure, the second VGA 40 can provide a phase change amount characteristic opposite to the change of the relative phase change amount according to the variable gain amount of the first VGA 30.

As described above, the wideband VGA 10 can vary the gain by using the first VGA 30 and the second VGA 40, which have opposite phase change characteristics according to the variable gain, in combination. According to the gain varying method, the phase changes by the first VGA 30 and the second VGA 40, respectively, due to the variable gain can be offset in the wide frequency range, thereby ensuring a small change in the phase.

Figure 2:
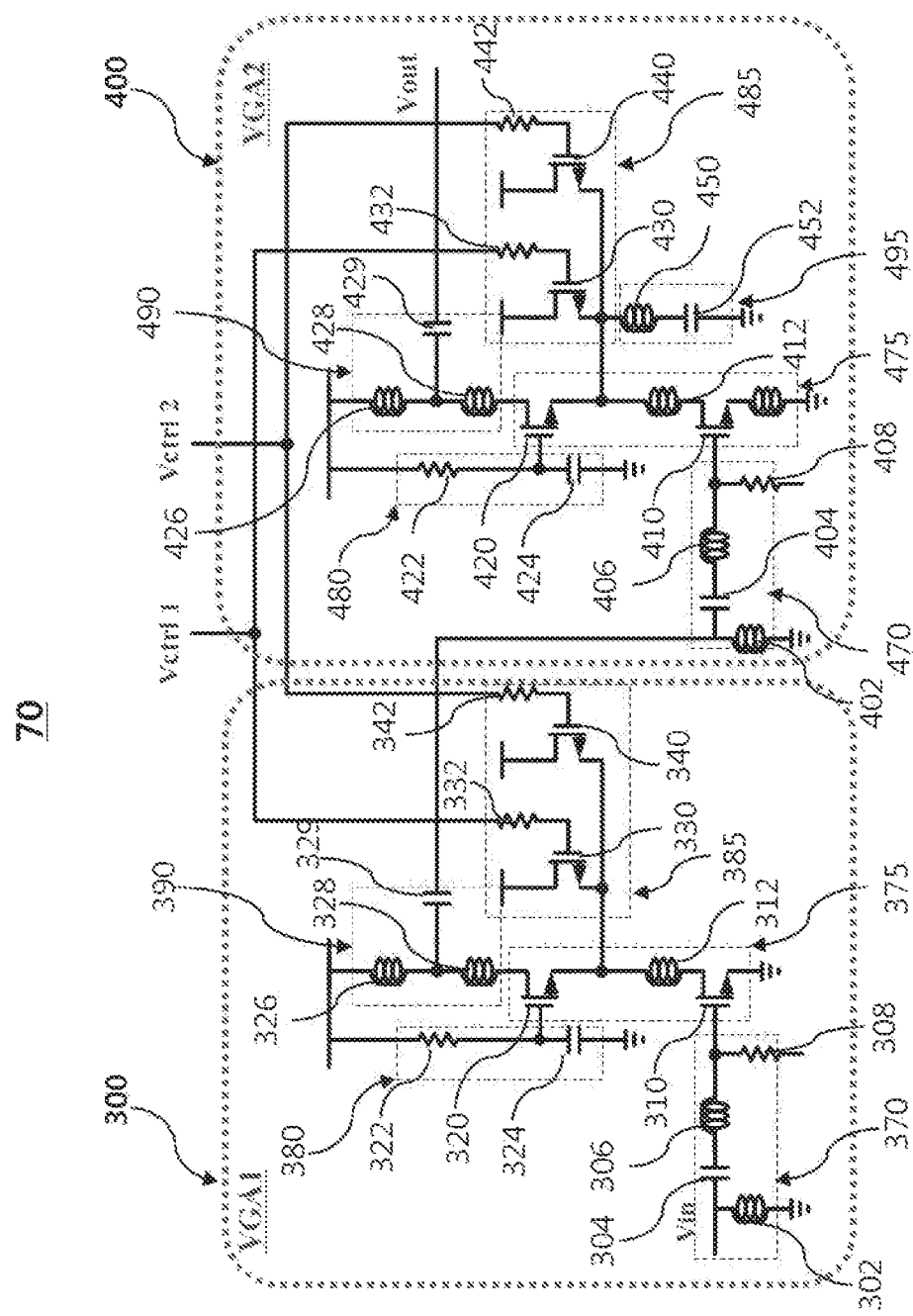
FIG. 2 is a circuit diagram of a wideband VGA in which an amplifying transistor is implemented as a metal-oxide-semiconductor field effect transistor (MOSFET) according to an exemplary embodiment of the present invention.

FIG. 2 is a detailed circuit diagram of a wideband VGA 70 in which an amplifying transistor is implemented as a MOSFET according to an exemplary embodiment of the present invention.

Referring to FIG. 2, the wideband VGA 70 may include a first VGA 300 and a second VGA 400. The output terminal of the first VGA 300 may be connected to the input terminal of the second VGA 400. An input signal Vin of the wideband VGA 70 may be amplified in two stages by the first VGA 300 and the second VGA 400.

The first VGA 300 may include a first two-stage variable amplification unit 375, a first input unit 370, a first bias voltage input unit 380, a first current steering variable gain amplification unit 385, and a first output unit 390.

In the first two-stage variable amplification unit 375 according to an exemplary embodiment, two signal amplifying transistors have a cascode-connection with each other to amplify the input Vin of the first VGA 300 by two stages (that is, multi-stage amplifying) and output the amplified signal. A variable amplification gain can be obtained with a low input/output matching change through the current steering control by the first current steering variable gain amplification unit 385 to be described later. An exemplary circuit of the first two-stage variable amplification unit 375 for this purpose may include a first field effect transistor 310, a second field effect transistor 320, and a third inductor 312. The first field effect transistor 310 may function as a CS amplifier for the input signal. The second field effect transistor 320 functions as a CG amplifier and can be cascade-coupled with the first field effect transistor 310. Furthermore, the third inductor 312, which is added between a drain (that is, an output terminal) of the first field effect transistor 310 and a source (that is, an input) of the second field effect transistor 320, may operate to secure a wideband cascode bandwidth during the two-staged cascode amplification operation by the first field effect transistor 310 and the second field effect transistor 320.

In an exemplary embodiment, the first input unit 370 may be configured to provide the first field effect transistor 310, which is located at the input terminal of the first two-stage variable amplification unit 375, with a bias voltage and an impedance-matched input signal of the first VGA 300. An exemplary circuit for the first input unit 370 for this purpose may include a first capacitor 304, first and second inductors 302 and 306, and a first resistor 308. The first capacitor 304 may be connected to the input terminal of the first VGA 300 and may block a DC component included in an input signal applied to the first two-stage variable amplification unit 375. The first inductor 302 is connected between the input terminal of the first VGA 300 and the ground, and the second inductor 306 is connected between the first capacitor 304 and the first field effect transistor 310. The first inductor 302 and the second inductor 306 may provide a conjugate input/output terminal impedance match. The first resistor 308 is grounded and connected to a connection node between the second inductor 306 and a gate of the first field effect transistor 310 to apply a gate bias voltage to the first field effect transistor 310

In an exemplary embodiment, the first bias voltage input unit 380 is grounded as well as connected Vdd to output a bias voltage from which an AC component is removed to the second transistor 320 located at an output terminal of the first two-stage variable amplification unit 375. The circuit of the exemplary first bias voltage input unit 380 for this purpose may include a second resistor 322 and a second capacitor 324. The second resistor 322 may be coupled between Vdd and a CG of the second field effect transistor 320 to supply a gate bias voltage. The second capacitor 324 is grounded and coupled to a connection node between the second resistor 322 and the CG of the second field effect transistor 320 so that the AC component included in the gate bias voltage of the second field effect transistor 320 can be shorted to the ground (gate signal AC shorting).

In an exemplary embodiment, the first current steering variable gain amplification unit 385 is connected to the connection node between the first field effect transistor 310 and the second field effect transistor 320 to be able to vary the amplification gain of the first two-stage variable amplification unit 375 through current steering. An exemplary circuit of the first current-steering variable gain amplification unit 385 for this purpose may include a third resistor 332 and a fourth resistor 342 for a digital control bias input, a third field effect transistor 330, and a fourth field effect transistor 340. The third resistor 332 may be connected to the first bias control voltage $V_{ctrl1}$ to input a digital control bias voltage to a gate of the third field effect transistor 330. The fourth resistor 334 may be connected to the second bias control voltage $V_{ctrl2}$ to input a digital control bias voltage to a gate of the fourth field effect transistor 340. The third field effect transistor 330 may have a source connected to the source of the second field effect transistor 320 and a gate connected to the third resistor 332. The fourth field effect transistor 340 may have a source connected to the source of the second field effect transistor 320 and a gate connected to the fourth resistor 342.

In an exemplary embodiment, the first output unit 390 is connected between Vdd and an output terminal of the first two-stage variable amplification unit 375, and may output an amplified output signal so as to block a DC component, and ensure impedance matching, and desired gain characteristics. An exemplary circuitry of the first output unit 390 for this purpose may include fourth and fifth inductors 326 and 328, and a third capacitor 329. The fourth and fifth inductors 326 and 328 are connected in series between Vdd and the drain of the second field effect transistor 320, which is the output terminal of the first two-stage variable amplification unit 375, to ensure impedance matching and gain characteristics. The third capacitor 329 may be connected between a connection node of the fourth inductor 326 and the fifth inductor 328 and the output terminal of the first VGA 300 to block the DC component.

The second VGA 400 may include a second two-stage variable amplification unit 475, a second input unit 470, a second bias voltage input unit 480, a second current steering variable gain amplification unit 485, a second output unit 490, and a phase adjusting unit 495.

In an exemplary embodiment, the second two-stage variable amplification unit 475, in which a third transistor and a fourth transistor are coupled to form a cascode amplifier, may receive an output signal of the first VGA 300 and amplify the received output signal by two stages. With this configuration, the second two-stage variable amplification unit 475 can provide a variable amplification gain by the current steering control. An exemplary circuit of the second two-stage variable amplification unit 475 for this purpose may include a fifth field effect transistor 410 functioning as the CS amplifier, and a sixth field effect transistor 420, coupled with the fifth field effect transistor 410 in a cascode structure, functioning as the CG amplifier.

According to an exemplary embodiment, the second input unit 470 may apply a bias voltage as well as an impedance-matched input signal for the second VGA 400 to the fifth transistor 410 located at the input terminal of the second two-stage variable amplification unit 475. An exemplary circuitry of the second input unit 470 for this purpose may include a fourth capacitor 404, sixth and seventh inductors 302, 306, and a fifth resistor 408. The fourth capacitor 404 is connected to the input terminal of the second VGA 400 and may block a DC component included in the input signal applied to the second two-stage variable amplification unit 475. The sixth and seventh inductors 302 and 306 are connected between the output terminal of the first VGA 300 and the ground and between the fourth capacitor 404 and a gate of the fifth field effect transistor 410, respectively, and can provide the conjugate input/output impedance matching. The fifth resistor 408 is grounded and connected to the connection node between the seventh inductor 306 and the gate of the fifth field effect transistor 410, and applies a gate bias voltage to the fifth field effect transistor 410.

In an exemplary embodiment, a circuit of the second bias voltage input unit 480 is connected between Vdd and the ground and outputs a bias voltage from which the AC component is removed to the sixth transistor 420 located at an output terminal of the second two-stage variable amplification unit 475. An exemplary circuit of the second bias voltage input unit 480 for this purpose may include a sixth resistor 422 and a fifth capacitor 424. The sixth resistor 422 may be coupled between Vdd and the CG of the sixth field effect transistor 420 to supply a gate bias voltage. The fifth capacitor 424 is grounded and connected to a connection node between the sixth resistor 422 and the CG of the sixth field effect transistor 420, so that the AC component included in the gate bias voltage of the sixth field effect transistor 420 can be shorted to the ground (gate signal AC shorting).

In an exemplary embodiment, the second current steering variable gain amplification unit 485 may be connected to the connection node of the fifth field effect transistor 410 and the sixth field effect transistor 420 and vary the amplification gain of the second two-stage variable amplification unit 475 by the current steering. The circuit of the second current steering variable gain amplification unit 485 for this purpose may include a seventh resistor 432, an eighth resistor 442, a seventh field effect transistor 430, and an eighth field effect transistor 440. The seventh resistor 432 may be coupled to a first bias control voltage $V_{ctrl1}$ and input a digital control bias voltage to the gate of the seventh field effect transistor 430. The eighth resistor 442 may be coupled to a second bias control voltage $V_{ctrl2}$ and input a digital control bias voltage to a gate of the eighth field effect transistor 440. The seventh field effect transistor 430 may have a source connected to a source of the sixth field effect transistor 420 and a gate connected to the seventh resistor 432. The eighth field effect transistor 440 may have a source connected to the source of the sixth field effect transistor 420 and a gate connected to the eighth resistor 442.

According to an exemplary embodiment, the second output unit 490 may be connected between Vdd and the output terminal of the second two-stage variable amplification unit 475, and may output an output signal amplified by the second two-stage variable amplification unit 475 such that DC component included the amplified output signal is filtered while ensuring impedance matching and gain characteristics. The exemplary circuitry for the second output unit 490 for this purpose may include ninth and tenth inductors 426 and 428 and a sixth capacitor 429. The ninth and tenth inductors 426 and 428 are connected in series between Vdd and a drain of the sixth field effect transistor 420 which is the output terminal of the second two-stage variable amplification unit 475, and can ensure the impedance matching and gain characteristic. The sixth capacitor 429 is connected between the output terminal of the second VGA 400 and the connection node of the ninth inductor 426 and the tenth inductor 428 and blocks the DC component.

In an exemplary embodiment, the phase adjusting unit 495 may adjust the phase change of an output signal of the second VGA 400 so that a relative phase change amount gradually increases in the positive direction as a variable gain amount of the second two-stage variable amplification unit 475 increases. An exemplary circuit of the phase adjusting unit 495 for this purpose may include a degeneracy inductor 450 and a seventh capacitor 452. The degeneracy inductor 450 may adjust a phase change amount of an output signal of the second VGA 400. The seventh capacitor 452 may function as a DC blocking capacitor for preventing the DC shorting caused by the degeneracy inductor 450. The degeneracy inductor 450 is disposed between the CS terminal of the seventh field effect transistor 430 of the CS structure and the CG of the sixth field effect transistor 420 and can act to change the phase change according to the variable gain as opposed to the current steering. By this operation of the degeneracy inductor 450, the biases of the first and second VGAs 300 and 400 can be simultaneously adjusted to obtain a low phase change even in a wideband.

The first and second field effect transistors 310 and 320, and the fifth and sixth field effect transistors 410 and 420 constituting the cascode two-stage amplifier may be implemented as a CMOS transistor, for example.

According to the wideband VGA 70 as described above, in the first VGA 300, the input signal Vin of the AC component provided through the first input unit 370 is applied to the gate of the first field effect transistor 310, along with the bias voltage provided through the first resistor 308, and is subject to the cascode two-stage amplification by the first field effect transistor 310 and the second field effect transistor 320. The frequency bandwidth of the cascode two-stage amplification may be wide by the third inductor 312 added between the first field effect transistor 310 and the second field effect transistor 320. During the amplification in the second field effect transistor 320, the third field effect transistor 330 and the fourth field effect transistor 340 of the first VGA 300 can function as the variable gain transistors that adjust the variable gain amount by steering the current flowing in the second field effect transistor 320. The current steering can be made according to the magnitudes of the control voltages $V_{ctrl1}$ and $V_{ctrl2}$ applied to the gates of the third and fourth field effect transistors 330 and 340 through the resistors 332 and 342, respectively.

Figure 6:
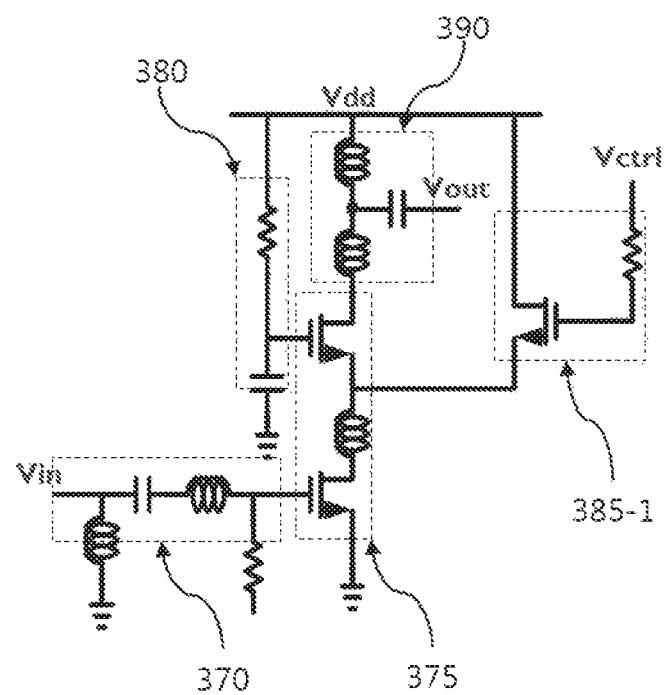
FIG. 6 illustrates a circuit configuration of a basic current-steering cascode two-stage VGA.
Figure 7:
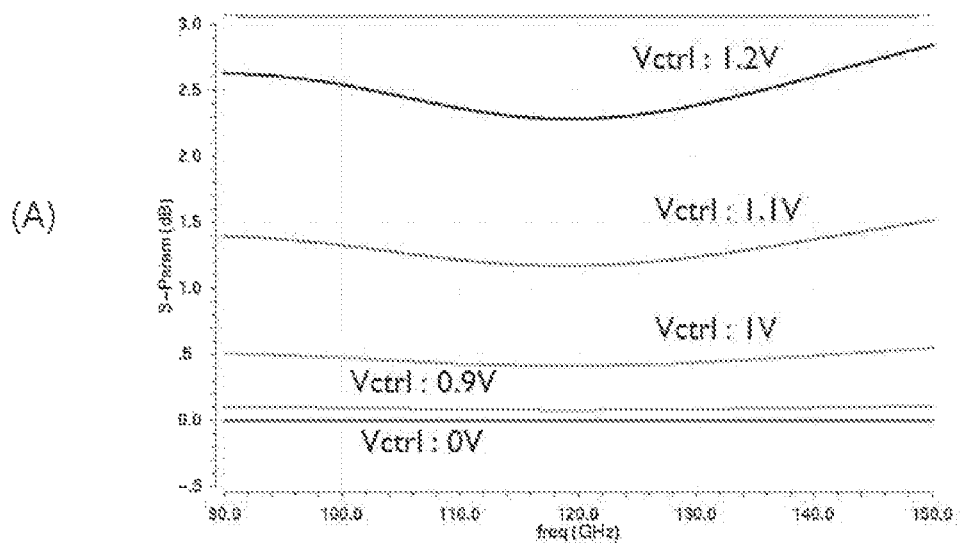
FIGS. 7A and 7B illustrate a gain change and a phase change according to the frequency according to the magnitude of the current steering control voltage, respectively, in the current-steering cascode two-stage VGA shown in FIG. 6.
Figure 7:
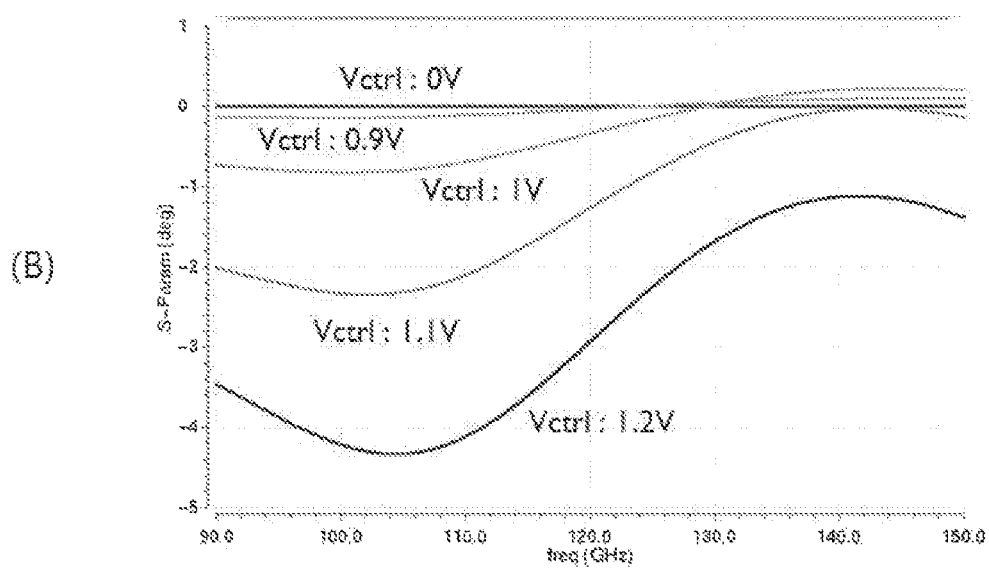

FIG. 6 illustrates a circuit configuration of a basic current steering cascode two-stage VGA 300-1. FIGS. 7 (A) and 7 (B) illustrate a gain change and a phase change, respectively, according to frequency for the magnitude of the current steering control voltage $V_{ctrl1}$ in the current steering cascode two-stage VGA 300-1 shown in FIG. 6. The circuit of the current steering cascode two-stage VGA 300-1 shown in FIG. 6 has a circuit configuration in which any one of $V_{ctrl1}$ and $V_{ctrl2}$ is used as the current steering control voltage in the circuit of the first VGA 300 shown in FIG. 2 (the any one bias voltage is represented by $V_{ctrl1}$ in FIGS. 6 and 7.

Referring to FIGS. 6 and 7, the current steering cascode two-stage VGA 300-1 circuit shown in FIG. 6 has an advantage that a variable gain can be obtained with a low input/output matching change. It should be noted that the graphs of FIG. 7 shows that the current steering cascode two-stage VGA 300-1 circuit shown in FIG. 6 has a relatively negative phase change as the gain is adjusted. This relative negative phase change characteristic may equally also appear in the first VGA 300 configured to use the two voltages $V_{ctrl1}$ and $V_{ctrl2}$ as the current steering control voltage. In the first VGA 300, the relative phase change amount when the gain is varied has a negative value as compared with when the gain is not varied. For example, if the phase is 90 degrees when the gain is not variable (i.e., at 0 dB control), then the phase may be 95 degrees when the gain is controlled to be varied by 4 dB. Therefore, the relative phase change amount may be −5 degrees (=90-95 degrees).

The second VGA 400 further includes the phase adjusting unit 495 as compared to the first VGA 300, but the other circuit configurations are the same as the first VGA 300.

Therefore, the second VGA 400 basically performs an amplification operation similar to that of the first VGA 300. That is, the second VGA 400 receives the output signal of the first VGA 300 through the second input unit 470 and amplifies the received signal into the cascode two-stage amplified signal by the second two-stage variable amplification unit 475. In the amplification the seventh field effect transistor 430 and the eighth field effect transistor 440 of the second current steering variable gain amplification unit 485 may function as the variable gain transistors to adjust the variable gain amount through steering the current flowing through the sixth field effect transistor 420 of the second two-stage variable amplification unit 475. The current steering can be made according to the magnitudes of the control voltages $V_{ctrl1}$ and $V_{ctrl2}$ applied to the gates of the seventh and eighth field effect transistors 430 and 440 through the resistors 432 and 442, respectively.

Figure 8:
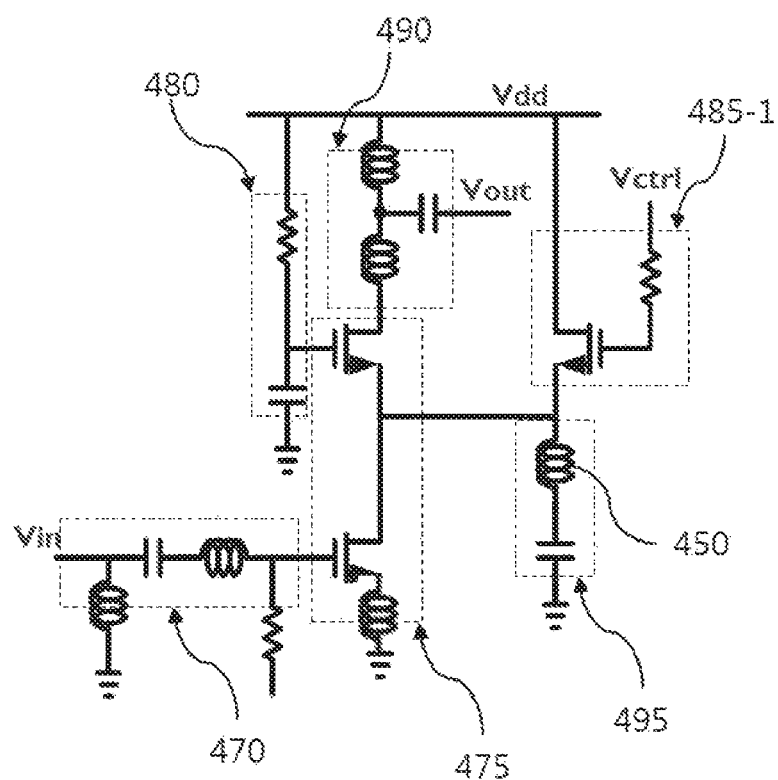
FIG. 8 illustrates a circuit configuration of a current steering cascode two-stage VGA that is configured by adding a phase adjusting unit using a degenerate inductor to the circuit of current-steering cascode two-stage VGA of FIG. 6.
Figure 9:
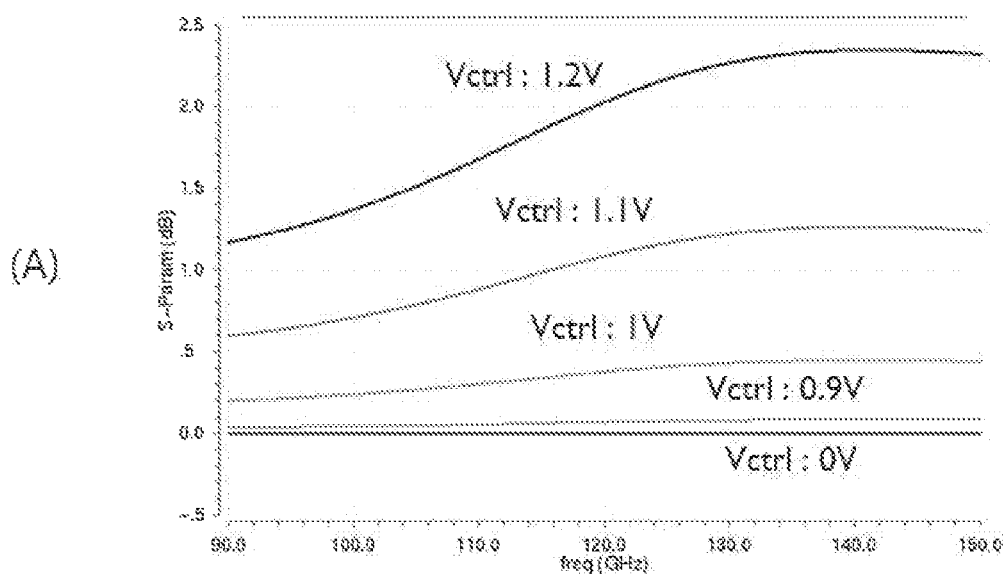
FIG. 9 illustrates a gain change and a phase change according to frequency for the magnitude of the current steering control voltage, respectively, in the current steering cascode two-stage VGA shown in FIG. 8.
Figure 9:
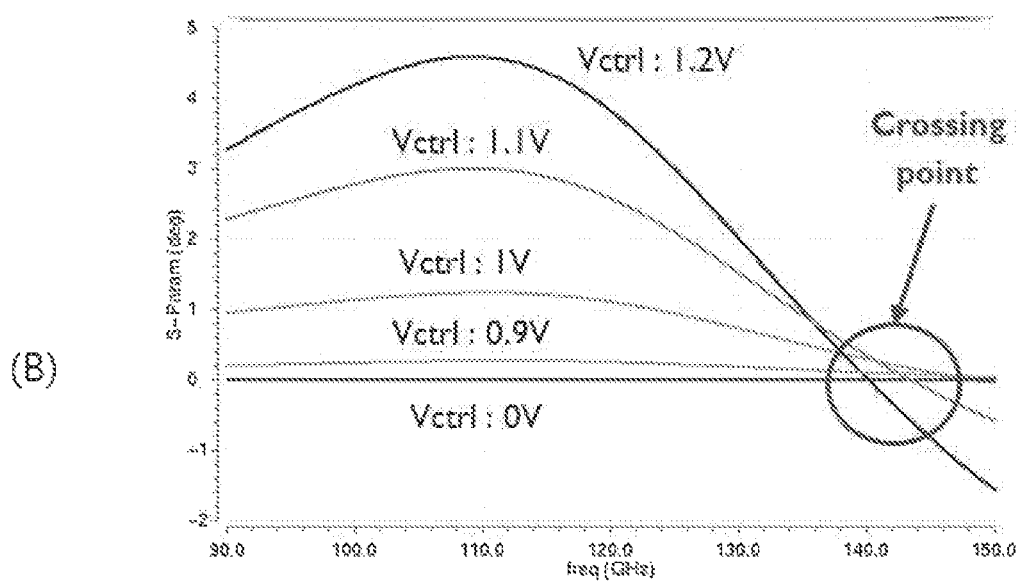

FIG. 8 illustrates a current steering cascode second-stage VGA 400-1 that is configured by adding the phase adjusting unit 495 using the degeneracy inductor 450 to the circuit of the current steering cascode two-stage VGA 300-1 of FIG. 6. FIG. 9 illustrates a gain change and a phase change according to frequency for each magnitude of the current steering control voltage $V_{ctrl}$ in the current steering cascode two-stage VGA 400-1 shown in FIG. 8. The circuit of the current steering cascode two-stage VGA 400-1 shown in FIG. 8 is a circuit configuration that uses only one of the current steering control voltages $V_{ctrl1}$ and $V_{ctrl2}$ (one of these two voltages is represented by $V_{ctrl1}$ in FIG. 8) in the circuit of the second VGA 400 shown in FIG. 2.

Referring to FIGS. 8 and 9, adjusting the value of the degeneracy inductor 450 may allow additional phase change control. As a result, the phase change can be reduced as the gain is varied. Therefore, the relative phase change amount when the gain is varied is positive compared to when the gain is not varied. For example, if the phase is 90 degrees when the gain is not variable (i.e., at 0 dB control), then the phase can be 85 degrees when the gain is changed by 4 dB. Therefore, the relative phase change amount may be 5 degrees (=90-85 degrees). Such a relatively positive phase change characteristic of the current steering cascode two-stage VGA 400-1 may equally appear in the second VGA 400 which is configured to use the two voltages $V_{ctrl1}$ and $V_{ctrl2}$ as the current steering control voltage. It should be noted that a position of the crossing point of the phase change can be adjusted by adjusting the size of the degeneracy inductor 450 as shown in FIG. 9 (B). This makes it possible to make a positive phase change according to the gain change in the desired frequency band.

The wideband VGA 70 shown in FIG. 2 includes the first VGA 300 that performs a cascode two-stage amplification in a basic current steering scheme, the second VGA 400 that further combines the degeneracy inductor structure with the first VGA 300, where the first VGA 300 and the second VGA 400 are the fore stage and the rear stage, respectively. In addition, the bias voltages $V_{ctrl1}$ and $V_{ctrl2}$ for steering the currents of the two VGAs 300 and 400 can be simultaneously adjusted. According to this configuration, it is possible to minimize the overall phase change due to the gain variation by simultaneously controlling the current steering bias voltages $V_{ctrl1}$ and $V_{ctrl2}$.

Figure 10:
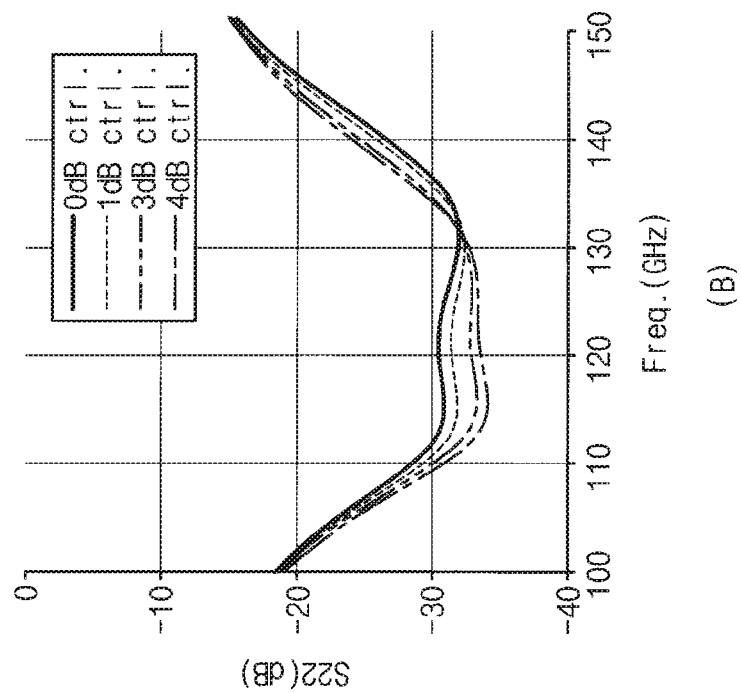
FIGS. 10A and 10B illustrate characteristics of the S11 and S22 parameters according to the adjustment of a current steering bias voltage in the wideband VGA shown in FIG. 2.
Figure 10:
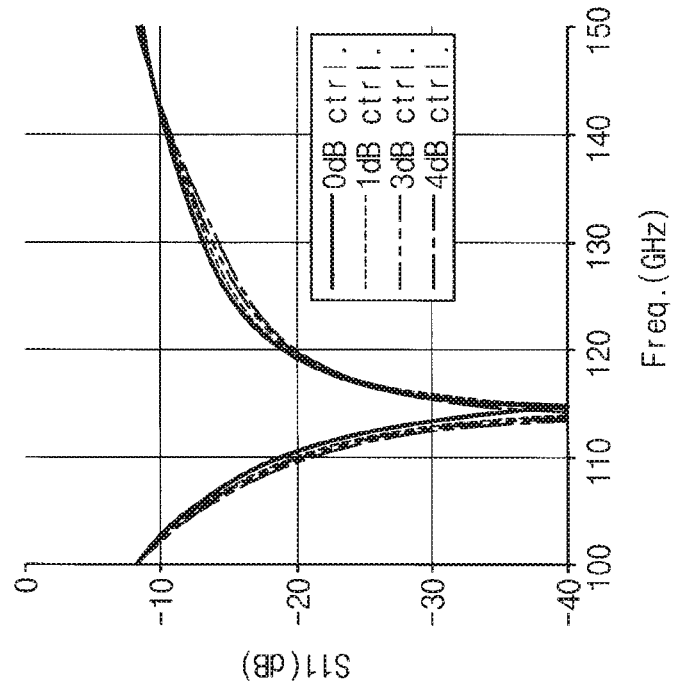

FIGS. 10 (A) and (B) illustrate the characteristics of the S11 parameter and the S22 parameter according to the adjustment of the current steering bias voltages $V_{ctrl1}$ and $V_{ctrl2}$ in a chip of the wideband VGA 70 thus designed as such. In addition, FIGS. 11 (A) and (B) show characteristics of the S21 parameter according to the adjustment of the current steering bias voltages $V_{ctrl1}$ and $V_{ctrl2}$ and the relative phase change according to the frequency change in the chip of the wideband VGA 70.

Figure 11:
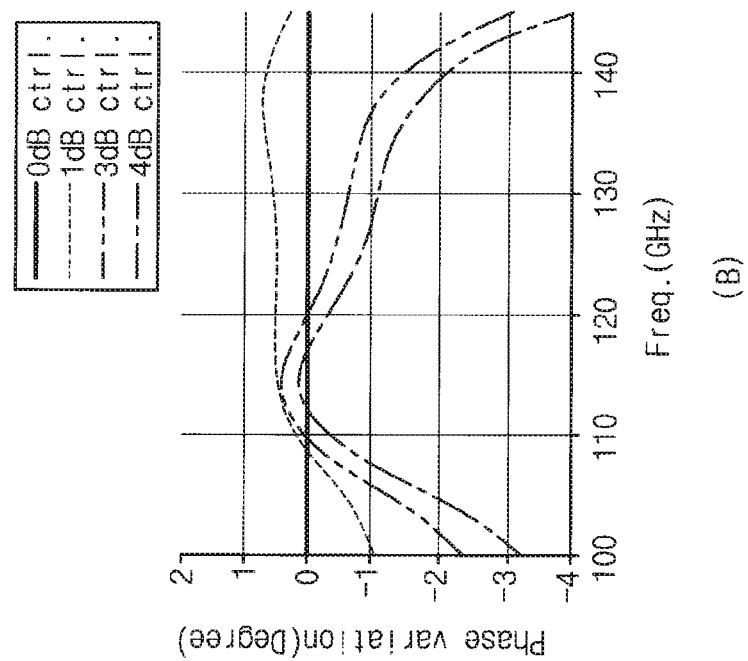
FIGS. 11A and 11B illustrate characteristics of the S21 parameter according to the adjustment of a current steering bias voltage and a relative phase change according to the frequency change in the wideband VGA shown in FIG. 2.
Figure 11:
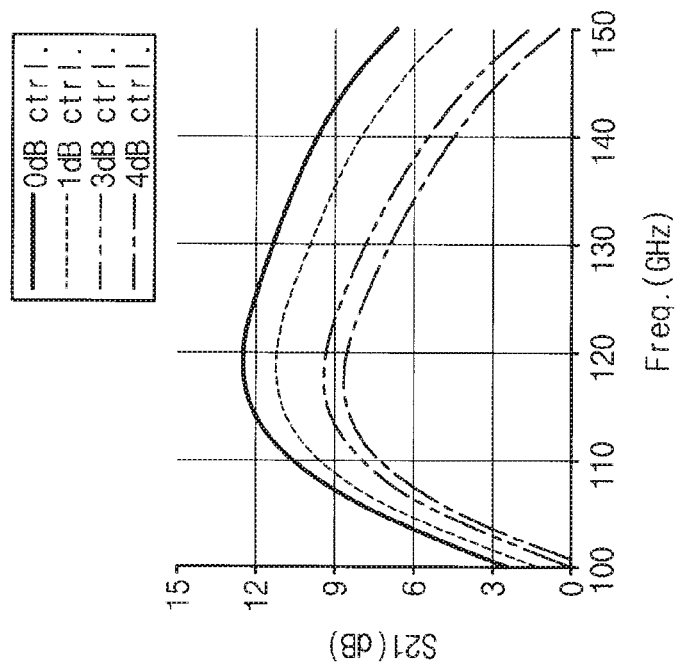

With reference to FIGS. 10 and 11, the wideband VGA 70 has S11 and S22 insertion loss of less than −10 dB in a wide frequency range from 105 GHz to 135 GHz, and has a maximum gain of 13 dB and a possible gain variation of 4 dB. It can be known that when varying the maximum gain of 4 dB, the wideband VGA 70 has the phase change which is almost close to 0 degree at the center frequency of 120 GHz, and the in-band phase change (ΔPhase) less than 2 degrees in the ultra-wideband frequency range (30 GHz) from 105 GHz to 135 GHz. This is a phase change characteristic due to very good variable gain amplification. Therefore, the wideband VGA 70 can be applied to various systems requiring a low phase change for fine variable gain control. For example, the wideband VGA 70 can be used as a VGA for beam forming. For the beamforming, it is necessary to adjust the phase of a sophisticated phase shifter.

Additional gain error may occur during the phase adjustment process. The VGA that compensates for the gain error should also have a low phase change across all frequency bands. The wideband VGA 70 according to the present invention can satisfy such a demand.

In the meantime, according to the circuit configuration of the first VGA 300 and the second VGA 400, the current steering bias voltages $V_{ctrl1}$ and $V_{ctrl2}$ for the first VGA 300 may be also used as the current steering bias voltages $V_{ctrl1}$ and $V_{ctrl2}$ for the second VGA 400. That is, the third field effect transistor 330 of the first VGA 300 and the seventh field effect transistor 430 of the second VGA 400 may be provided with a common first control bias voltage $V_{ctrl1}$, and the fourth field effect transistor 340 of the first VGA 300 and the eighth field effect transistor 440 of the second VGA 400 may be provided with a common second control bias voltage $V_{ctrl2}$. The first VGA 300 and the second VGA 400 may simultaneously generate a variable gain by changing at least one of the first control bias voltage $V_{ctrl1}$ and the second control bias voltage $V_{ctrl2}$. The first control bias voltage $V_{ctrl1}$ and the second control bias voltage $V_{ctrl1}$ may be set to any one of a voltage corresponding to ON and a voltage corresponding to OFF. By doing so, the variable gains obtained by the first VGA 300 and the second VGA 400 may be a digitally variable value instead of being changed in an analog manner. Using these operation characteristics, ON/OFF digital control as outlined in Table 1 below may be possible. That is, if the current steering bias voltages $V_{ctrl1}$ and $V_{ctrl2}$ are set to 0 [V] (corresponding to 'OFF') or 1.1 [V] (corresponding to 'ON') without analog control, the gain can be varied digitally by 0, 1, 3, and 4 dB as shown in Table 1. This means that the variable gain amount of the wideband VGA 70 can be adjusted by adjusting the control bias voltages $V_{ctrl1}$ and $V_{ctrl2}$ with a two-bit signal.

TABLE 1

| Control | $V_{ctrl1}$ | $V_{ctrl2}$ |
| --- | --- | --- |
| 0 dB control | 0 V | 0 V |
| 1 dB control | 1.1 V | 0 V |
| 3 dB control | 0 V | 1.1 V |
| 4 dB control | 1.1 V | 1.1 V |

Figure 3:
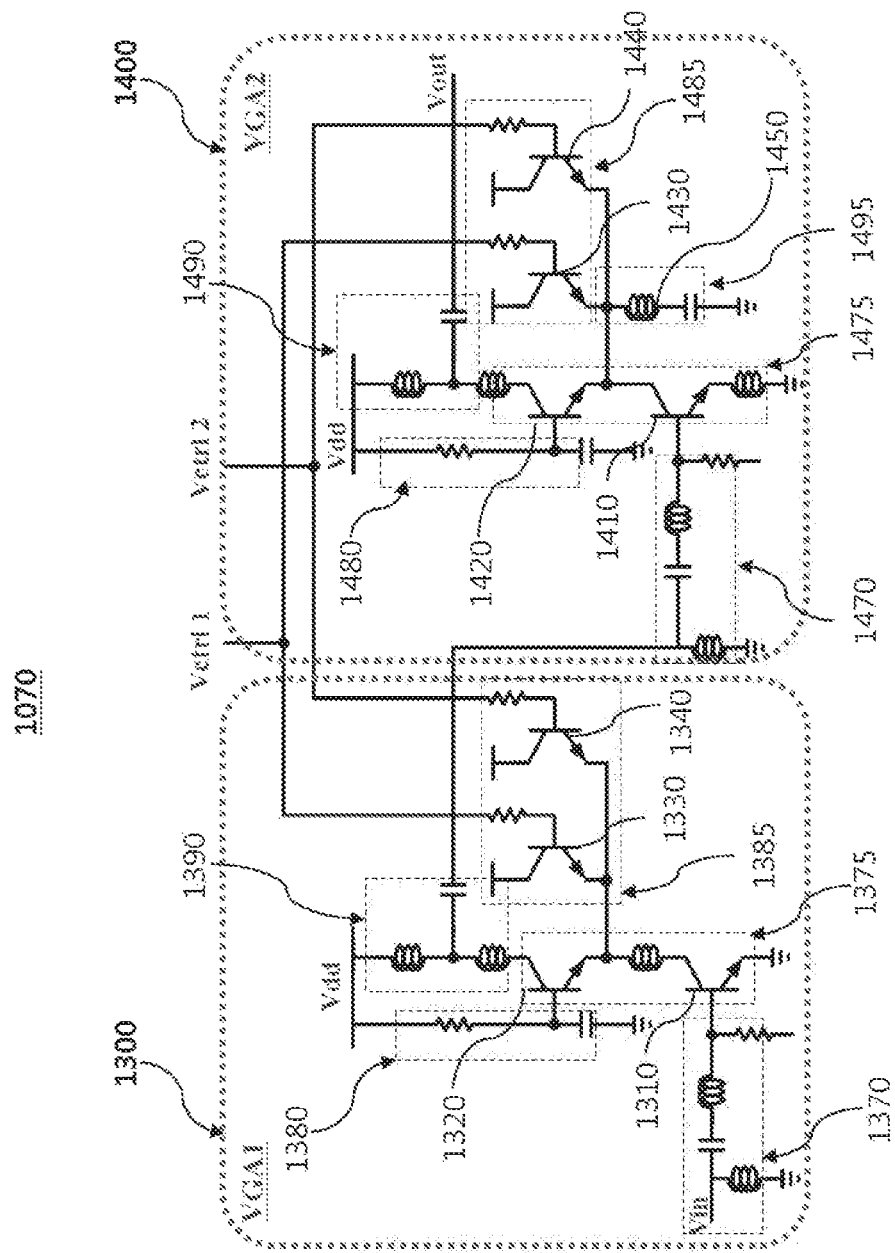
FIG. 3 is a circuit diagram of a wideband VGA in which an amplifying transistor is implemented as a bipolar junction transistor (BJT) according to another exemplary embodiment of the present invention.

Next, FIG. 3 illustrates a circuit of a wideband VGA 1070 in which an amplifying transistor is implemented as a bipolar junction transistor (BJT) according to another exemplary embodiment of the present invention.

Referring to FIG. 3, in comparison with the wideband VGA 70 shown in FIG. 2, the wideband VGA 1070 is different from the wideband VGA 70 in that all the amplifying and current steering transistors are replaced by bipolar junction transistors (BJTs) (There may be also differences in the manufacturing process or layout of the circuit elements accordingly). However, the wideband VGA 1070 may be substantially the same as the wideband VGA 70 of FIG. 2 in the configuration of the remaining circuit. That is, the wideband VGA 1070 may include a first VGA 1300 and a second VGA 1400. The output terminal of the first VGA 1300 is connected to the input terminal of the second VGA 1400. The wideband VGA 1070 may generate a two-stage-amplified output signal $V_{out}$ obtained by amplifying the input signal $V_{in}$ by the first VGA 1300 and the second VGA 1400 in two stages.

The first VGA 1300 may include a first two-stage variable amplification unit 1375, a first input unit 1370, a first bias voltage input unit 1380, a first current steering variable gain amplification unit 1385, and a first output unit 1390. The second VGA 1400 may include a second two-stage variable amplification unit 1475, a second input unit 1470, a second bias voltage input unit 1480, a second current steering variable gain amplification unit 1485, a second output unit, and a phase adjustment unit 1495. In the first VGA 1300, first and second transistors 1310 and 1320 constituting a cascode amplifier of the first two-stage variable amplification unit 1375, and the third and fourth transistors 1330 and 1340 for current steering of the first current steering variable gain amplification unit 1385 may be implemented as BJTs. Similarly, in the second VGA 1400, fifth and sixth transistors 1410 and 1420 constituting the cascode amplifier of the second two-stage variable amplification unit 1475 and seventh and eighth transistors 1430 and 1440 for current steering of the second current steering variable gain amplification unit 1485 may also be implemented as BJTs. The phase adjustment unit 1495 of the second VGA 1400 may also include a phase adjusting degeneracy inductor 1450 for obtaining a positive phase change.

The functions and operations of the components of the first VGA 1300 and the second VGA 1400 of the wideband VGA 1070 shown in FIG. 3 may be substantially the same as the functions and operations of the corresponding components of the first VGA 300 and the second VGA 400, and thus detailed description thereof will be omitted here.

Meanwhile, referring back to FIG. 1, since the wideband VGA 10 includes the first VGA 30 and the second VGA 40 cascode-coupled in two-stages, when the gain is varied, the impedance matching of the input stage and the output stage may be greatly changed depending on an amount of the gain change. In this connection, by adding circuits for impedance matching to the input and output stages, it is possible to reduce the change of impedance matching between the input and output stages.

For this purpose, the wideband VGA 10 may further include an input stage impedance matching amplifier 50. The input stage impedance matching amplifier 50 may be added to the front end of the first VGA 30. The input stage impedance matching amplifier 50 may preliminarily amplify the input of the first VGA 30 to reinforce the insufficient gain and ensure the impedance matching between the input and the output of the wideband VGA 10.

The wideband VGA 10 may further include an output stage impedance matching amplifier 60. The output stage impedance matching amplifier 60 may be added to the rear end of the second VGA 40. The output stage impedance matching amplifier 60 may amplify the two-stage amplified output obtained from the second VGA 40 to reinforce the insufficient gain. In addition, the output stage impedance matching amplifier 60 can ensure the impedance matching between the input and the output of the wideband VGA 10 and enhance the linearity of the output voltage.

Figure 4:
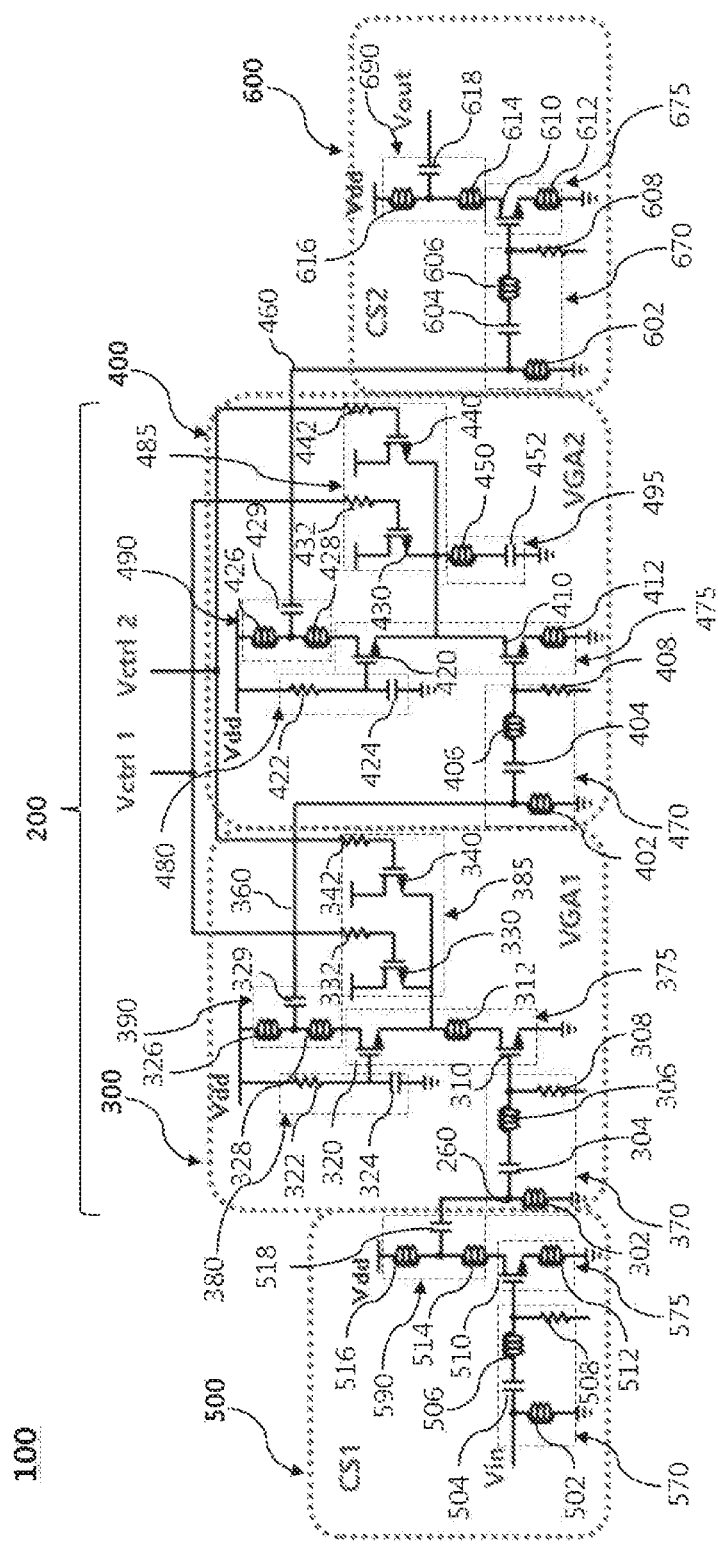
FIG. 4 is a circuit diagram of a wideband VGA in which impedance matching amplifying units are added to input and output ports of the wideband VGA shown in FIG. 2 according to another exemplary embodiment of the present invention.

FIG. 4 is a circuit diagram of the wideband VGA 100 (FIG. 2) according to another exemplary embodiment of the present invention, in which impedance matching amplifiers 500 and 600 are added to the input and output stages of the wideband VGA 70 of FIG. 2, respectively.

Referring to FIG. 4, in addition to the first VGA 300 and the second VGA 400 of the wideband VGA 70 shown in FIG. 2, the wideband VGA 100 includes the input stage impedance matching amplifier 500 and an output stage impedance matching amplifier 600.

The input stage impedance matching amplifier 500 may be an exemplary circuit of the input stage impedance matching amplifier 50 of FIG. 1. The input stage impedance matching amplifier 500 may be added to the front end of the first VGA 300. The input stage impedance matching amplifier 500 may include an input unit 570, an amplification unit 575, and an output unit 590.

The amplification unit 575 may include an inductor 512 and a field effect transistor 510 acting as the CS amplifier. The inductor 512 may be coupled between the source of the field effect transistor 510 and ground. The field effect transistor 510 may be implemented as the CMOS transistor.

The input unit 570 may include inductors 502 and 506 for conjugate input/output matching at each stage, a capacitor 504 for blocking the DC component, and a resistor 508 for supplying a gate bias voltage. The inductor 502 may be connected between the input terminal and ground. The capacitor 504 and the inductor 506 may be connected in series to each other and connected between the input terminal and the gate of the field effect transistor 510 of the amplification unit 575. The resistor 508 may be connected to the gate of the field effect transistor 510 to supply a gate bias voltage.

The output unit 590 may include the inductors 514 and 516 connected in series between the Vdd and the drain of the field effect transistor 510, and a capacitor 518, connected to the connection node between the two inductors 514 and 516, for blocking the DC component included in the output signal.

Being disposed at the front end of the first VGA 300, the input stage impedance matching amplifier 500 can compensate for the insufficient amplification gain of a variable gain two-staged amplifier 200 and secure additional linearity and stable input/output matching characteristics.

The output stage impedance matching amplifier 600 is an exemplary circuit of the output stage impedance matching amplifier 60 of FIG. 1. The output stage impedance matching amplifier 600 may be added to the rear end of the second VGA 400. The output stage impedance matching amplifier 600 may also include an input unit 670, an amplification unit 675, and an output unit 690.

The amplification unit 675 may include an inductor 612 and a field effect transistor 610 acting as the CS amplifier. The inductor 612 may be coupled between the source of the field effect transistor 610 and ground. The field effect transistor 610 may be implemented, for example, as the CMOS transistor.

The input unit 670 may include inductors 602 and 606 for conjugate input/output matching at each stage, a capacitor 604 for blocking DC component, and a resistor 608 for supplying a gate bias voltage. The inductor 602 may be grounded and connected to the input terminal. The capacitor 604 and the inductor 606 may be connected in series between the input terminal and the gate of the field effect transistor 610 of the amplifier 675. The resistor 608 may be connected to the gate of the field effect transistor 610 to supply a gate bias voltage.

The output unit 690 may include inductors 614 and 616 connected in series between Vdd and the drain of the field effect transistor 610, and a capacitor 618, connected to the connection node between the two inductors 614 and 616, for blocking the included DC component.

The output stage impedance matching amplifier 600 may be disposed at the rear end of the second VGA 400 to compensate the insufficient amplification gain of the variable gain two-staged amplifier 200 and to provide additional linearity of the output signal $V_{out}$ and stable input/output matching characteristic.

As such, the wideband VGA 100 may include amplifiers connected in a total of four stages. That is, the first VGA 300 having the basic current steering structure and the second VGA 400 having the current steering structure using the degeneracy inductor 450 constitute the two-staged amplifier 200. Also, the input/output stage impedance matching amplifiers 500 and 600 are added to the front end and rear end of the two-stage amplifier 200, respectively, to reinforce the impedance matching and the amplification gain. The input stage impedance matching amplifier 500 and the output stage impedance matching amplifier 600 may be added to the input and output terminals of the variable gain two-staged amplifier 200 to be able to reduce the impedance matching change at the input and output stages, and to secure an insufficient amplification gain of the variable gain two-staged amplifier 200 and to provide a stable input/output matching characteristic. That is, the first VGA 300 and the second VGA 400 of the wideband VGA 70 may be a circuit configuration focused on reducing phase variation. Therefore, the gain of the entire circuit of the wideband VGA 70 may not be relatively sufficient. The input stage impedance matching amplifier 500 and the output stage impedance matching amplifier 600 can further enhance the amplification gain of the wideband VGA 70. In addition, the output stage impedance matching amplifier 600 can increase the output linearity of the entire circuit by using the CS amplifier 610.

Figure 5:
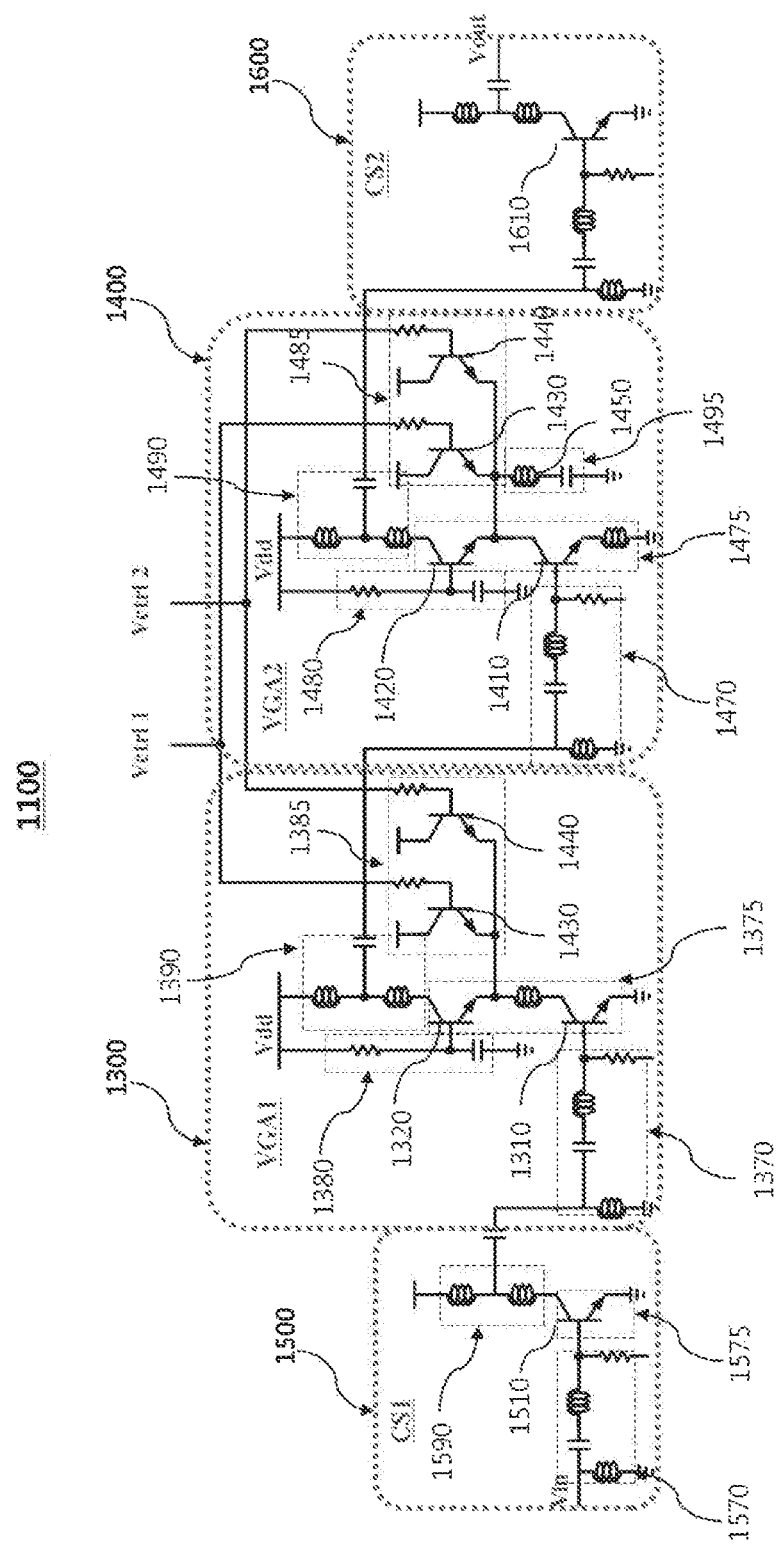
FIG. 5 is a circuit diagram of a wideband VGA in which impedance matching amplifying units are added to input and output ports of the wideband VGA shown in FIG. 3 according further another exemplary embodiment of the present invention.

FIG. 5 is a circuit of a wideband VGA 1100 according to another exemplary embodiment of the present invention, in which impedance matching amplifiers 1500 and 1600 are added to the input and output terminals of the wideband VGA 1070 shown in FIG. 3.

Referring to FIG. 5, in comparison with the wideband VGA 100 shown in FIG. 4, the wideband VGA 1100 is different from the wideband VGA 100 in that all the amplifying and current steering transistors are replaced by the BJTs instead of the MOSFETs (There may be also differences in the manufacturing process or layout of the circuit elements accordingly). However, the wideband VGA 1100 may be substantially the same as the wideband VGA 100 of FIG. 4 in the configuration of the remaining circuit.

Specifically, the wideband VGA 1100 may include the first VGA 1300, the second VGA 1400, an input stage impedance matching amplifier 1500, and an output stage impedance matching amplifier 1600. The first VGA 1300 and the second VGA 1400 of the wideband VGA 1100 may be the same first VGA 1300 and second VGA 1400 as the wideband VGA 1070 shown in FIG. 3. That is, the output terminal of the first VGA 1300 may be connected to the input terminal of the second VGA 1400. The output terminal of the input stage impedance matching amplifier 1500 may be connected to the input terminal of the first VGA 1300. The output terminal of the second VGA 1400 may be coupled to the input terminal of the output stage impedance matching amplifier 1600. As mentioned above, the first VGA 1300 may include the first two-stage variable amplification unit 1375, the first input unit 1370, the first bias voltage input unit 1380, the first current steering variable gain amplification unit 1385, and the first output unit 1390. As mentioned above, the second VGA 1400 may include the second two-stage variable amplification unit 1475, the second input unit 1470, the second bias voltage input unit 1480, the second current steering variable gain amplification unit 1485, a second output unit 1490, and the phase adjustment unit 1495. In particular, all transistors 1310, 1320, 1330, 1340, 1410, 1420, 1430, and 1440 may be implemented as BJTs. The phase adjustment unit 1495 of the second VGA 1400 may also include a phase adjusting degeneracy inductor 1450 for obtaining a positive phase change.

Further, the wideband VGA 1100 may further includes an input stage impedance matching amplifier 1500 added to the front end of the first VGA 1300 and an output stage impedance matching amplifier 1600 added to the rear end of the second VGA 1400. The functions and operations of the input stage impedance matching amplifier 1500 and the output stage impedance matching amplifier 1600 are substantially the same as those of the input stage impedance matching amplifier 500 and the output stage impedance matching amplifier 600 shown in FIG. 4.

In all of the embodiments described above, the first VGAs 30, 300, and 1300 and the second VGAs 40, 400, and 1400 may swap positions. That is, the second VGA 40, 400, or 1400 may be disposed at the front stage and the first VGA 30, 300, or 1300 may be disposed at the rear end of the second VGA 40, 400, or 1400. According to such a modified embodiment, the second VGA 40, 400, or 1400 in the front stage may amplify the input signal by the current steering manner so that the amplification gain is varied. The amplification can be performed so that the relative phase change amount gradually increases in the positive direction as the variable gain amount of the amplified output signal becomes larger. The first VGA 30, 300, or 1300 at the rear stage may receive the output signal amplified by the second VGA 40, 400, or 1400 as input and further amplify the signal in the current steering manner to output an amplified signal. The amplification can be performed so that the relative phase change amount gradually increases in the negative direction as the variable gain amount of the amplified output signal becomes larger. As a result, according to the VGA device according to the modified embodiment having such a configuration, the opposing phase changes of the second VGA 40, 400, or 1400 and the first VGA 30, 300, or 1300 are offset against each other, and a variable amplification gain for the input signal over a wide frequency range can be provided.

The present invention can be used variously in a wireless communication system requiring variable gain control, an electronic system such as an audio level compression, a synthesizer, an amplitude modulator, an automatic level control loop and a phased array system.

The above description is intended to illustrate exemplary embodiments and should not be construed as limiting the present invention. Although several exemplary embodiments have been described, those skilled in the art will readily appreciate that many modifications are possible in the exemplary embodiments without materially departing from the novel teachings and advantages of this disclosure.

Accordingly, all such modifications are intended to be included within the scope of the present disclosure as defined in the claims.

What is claimed is:

1. A wideband variable gain amplification device, comprising:
a first variable gain amplifier configured to amplify an input signal in a current steering manner to be output with a variable gain amount such that a relative phase change amount gradually increases in any one of a positive direction and a negative direction as a variable gain amount of a first amplified output signal from the first variable gain amplifier becomes larger; and
a second variable gain amplifier configured to have an input terminal connected to an output terminal of the first variable gain amplification unit, further amplify the first amplified output signal received from the first variable gain amplifier in the current steering manner with a variable amplification gain so that a relative phase change amount gradually increases in a direction opposite to a phase change direction by the first variable gain amplifier as a variable gain amount of a second amplified output signal from the second variable gain amplifier becomes larger,
wherein a variable amplification gain for the input signal is provided over a wide frequency range with a low phase change as a phase difference between the first variable gain amplifier and the second variable gain amplifier is canceled.

2. The wideband variable gain amplification device of claim 1, wherein the second variable gain amplifier is configured to include a phase adjustment unit that is configured to adjust a phase change amount of the output signal from the second variable gain amplifier by using a degeneracy inductor such that a relative phase change amount gradually increases in a positive direction as a variable gain amount increases.

3. The wideband variable gain amplification device of claim 1, wherein the first variable gain amplifier includes at least first and second variable gain transistors for controlling an amplification operation through current steering, and the second variable gain amplifier includes at least third and fourth variable gain transistors for controlling an amplification operation through current steering, and wherein the first and third variable gain transistors are configured to receive a common first control bias voltage, and the second and fourth variable gain transistors are configured to receive a common second control bias voltage, so that the first variable gain amplifier and the second variable gain amplifier perform amplification operations to simultaneously produce variable gains by varying at least one of the first control bias voltage and the second control bias voltage.

4. The wideband variable gain amplification device of claim 3, wherein the variable gain obtained by in each of the first variable gain amplifier and the second variable gain amplifier is changed digitally instead of being changed analogously by setting each of the first control bias voltage and the second control bias voltage to any one of a voltage corresponding to ON and a voltage corresponding to OFF.

5. The wideband variable gain amplification device of claim 1, wherein the first variable gain amplifier comprises: a first two-stage variable amplification unit, configured to be a cascade amplifier formed with a first and second transistors, and to multi-stage amplify an input signal of the first variable gain amplifier to be output so that a variable amplification gain is obtained by current steering control; a first input unit configured to provide a bias voltage and an impedance-matched input signal of the first variable gain amplifier to the first transistor located at an input terminal of the first two-stage variable amplification unit; a first bias voltage input unit, connected between Vdd and ground, and configured to provide a bias voltage from which an AC component is removed to the second transistor located at an output terminal of the first two-stage variable amplification unit; a first current steering variable gain amplification unit, connected to a connection node between the first transistor and the second transistor, and configured to vary an amplification gain of the first two-stage amplification unit by current steering; and a first output unit, connected between Vdd and an output terminal of the first two-stage variable amplification unit, and configured to output an output signal amplified by the first two-stage variable amplification unit so as to block a direct current component and ensure impedance matching and gain characteristics.

6. The wideband variable gain amplification device of claim 5, wherein the first two-stage variable amplification unit comprises a first field effect transistor functioning as a common-source amplifier; a second field effect transistor functioning as a common-gate amplifier and coupled with the first field effect transistor to form a cascode amplifier; and a third inductor, connected between a drain, which is an output terminal, of the first field effect transistor and a source, which is an input terminal, of the second field effect transistor, and being operable to secure a wideband cascode bandwidth, wherein the first input unit comprises a first capacitor connected to an input terminal of the first variable gain amplifier and blocking a direct current component included in an input signal applied to the first two-stage variable amplification unit; first and second inductors, coupled between an input of the first variable gain amplifier and ground and between the first capacitor and the gate of the first field effect transistor, respectively, and providing a conjugate input and output impedance match; and a first resistor connected between the second inductor and a connection node between a gate of the first field effect transistor and ground, and supplying a gate bias voltage to the first field effect transistor, wherein the first bias voltage input unit comprises a second resistor connected between Vdd and a common gate of the second field effect transistor to supply a gate bias voltage; and a second capacitor, connected between ground and a connection node between the second resistor and a common gate of the second field effect transistor, and to short an AC component included in a gate bias voltage of the second field effect transistor to be grounded, wherein the first current steering variable gain amplification unit comprises a third resistor connected to a first bias control voltage for a digital control bias input; a fourth resistor connected to a second bias control voltage for a digital control bias input; a third field effect transistor having a source connected to a source of the second field effect transistor and a gate connected to the third resistor; and a fourth field effect transistor having a source connected to a source of the second field effect transistor and a gate connected to the fourth resistor, and wherein the first output unit comprises fourth and fifth inductors, connected in series between Vdd and a drain, which is an output terminal of the first two-stage variable amplification unit, of the second field effect transistor, and providing impedance matching and ensuring gain characteristics; and a third capacitor, connected between a connection node of the fourth inductor and the fifth inductor and an output terminal of the first variable gain amplifier, and blocking a direct current component.

7. The wideband variable gain amplification device of claim 1, wherein the second variable gain amplifier comprises: a second two-stage variable amplification unit, including third and fourth transistors coupled to constitute a cascode amplifier, configured to two-state amplify an output signal received from the first variable gain amplifier such that a variable amplification gain is obtained by current steering; a second input unit configured to provide a bias voltage and an impedance matched input signal of the second variable gain amplifier to the third transistor located at an input terminal of the second two-stage variable amplification unit; a second bias voltage input unit, connected between Vdd and ground, and configured to provide a bias voltage from which an alternating current component is removed to the fourth transistor located at an output terminal of the second two-stage variable amplification unit; a second current steering variable gain amplification unit, connected to a connection node between the first transistor and the second transistor, and configured to vary an amplification gain of the second two-stage amplification unit by current steering; a second output unit, connected between Vdd and an output terminal of the second two-stage variable amplification unit, and configured to output an output signal amplified by the second two-stage variable amplification unit such that a direct component is blocked and impedance matching and gain characteristic are ensured; and a phase adjustment unit configured to adjust a phase change amount of the output signal of the second variable gain amplifier using a degeneracy inductor so that a relative phase change amount gradually increases in a positive direction as a variable gain amount of the second two-stage variable amplification unit increases.

8. The wideband variable gain amplification device of claim 7, wherein the second two-stage variable amplification unit comprises a fifth field effect transistor functioning as a common-source amplifier; and a sixth field effect transistor functioning as a common-gate amplifier and coupled with the fifth field effect transistor to form a cascode amplifier, wherein the second input unit comprises a fourth capacitor, connected to an input terminal of the second variable gain amplifier, and blocking a direct current component included in an input signal applied to the second two-stage variable amplification unit; sixth and seventh inductors, coupled between an output terminal of the first variable gain amplifier and the ground and between the fourth capacitor and a gate of the fifth field effect transistor, respectively, and providing conjugate input/output impedance matching; and a fifth resistor connected between ground and a connection node of the seventh inductor and a gate of the fifth field effect transistor, and supplying a gate bias voltage to the fifth field effect transistor, wherein the second bias voltage input unit comprises a sixth resistor connected between Vdd and a common gate of the sixth field effect transistor and supplying a gate bias voltage; and a fifth capacitor, connected between ground and a connection node of the sixth resistor and a common gate of the sixth field effect transistor, and shorting an alternating current component included in the gate bias voltage for the sixth field effect transistor to ground, wherein the second current steering variable gain amplification unit comprises a seventh resistor, coupled to a first bias control voltage, for a digital control bias input; an eighth resistor, coupled to a second bias control voltage, for a digital control bias input; a seventh field effect transistor having a source connected to a source of the sixth field effect transistor and a gate connected to the seventh resistor; and an eighth field effect transistor having a source connected to a source of the fifth field effect transistor and a gate connected to the eighth resistor, wherein the second output unit comprises ninth and tenth inductors, connected in series between Vdd and a drain of the sixth field effect transistor, which is an output terminal of the second two-stage variable amplification unit, and securing impedance matching and gain characteristics; and a sixth capacitor, connected between a connection node of the ninth inductor and the tenth inductor and an output terminal of the second variable gain amplifier, and blocking a direct current component, and wherein the phase adjustment unit comprises a degeneracy inductor for adjusting a phase change amount of an output signal of the second variable gain amplifier; and a seventh capacitor for blocking direct current shorting caused by the degeneracy inductor.

9. The wideband variable gain amplification device of claim 1, further comprising an input stage impedance matching amplifier, added to a front end of the first variable gain amplifier, and reinforcing an insufficient gain by pre-amplifying an input of the first variable gain amplifier and providing impedance matching between an input terminal and an output terminal of the variable gain amplification device.

10. The wideband variable gain amplification device of claim 1, further comprising an output stage impedance matching amplifier, added to a rear end of the second variable gain amplifier, and reinforcing an insufficient gain by re-amplifying a two-stage amplified output obtained from the second variable gain amplifier, providing impedance matching between an input terminal and an output terminal of the variable gain amplification device, and enhancing linearity of an output voltage.

11. The wideband variable gain amplification device of claim 1, wherein the first variable gain amplifier performs amplification so that a relative phase change amount gradually increases in a negative direction as a variable gain amount of the first output signal becomes larger, and the second variable gain amplifier performs amplification so that a relative phase change amount gradually increases in a positive direction as a variable gain amount of the second output signal becomes larger.

12. A wideband variable gain amplification device, comprising:
 a first variable gain amplifier configured to amplify an input signal in a current steering manner to be output with a variable gain amount such that a relative phase change amount gradually increases in any one of a positive direction and a negative direction as a variable gain amount of a first amplified output signal from the first variable gain amplifier becomes larger;
 a second variable gain amplifier configured to have an input terminal connected to an output terminal of the first variable gain amplification unit, further amplify the first amplified output signal received from the first variable gain amplifier in the current steering manner with a variable amplification gain so that a relative phase change amount gradually increases in a direction opposite to a phase change direction by the first variable gain amplifier as a variable gain amount of a second amplified output signal from the second variable gain amplifier becomes larger, while adjusting a phase change amount by using a degeneracy inductor;
 an input stage impedance matching amplifier, added to a front end of the first variable gain amplifier, and reinforcing an insufficient gain by pre-amplifying an input of the first variable gain amplifier and providing impedance matching between an input terminal and an output terminal of the variable gain amplification device; and
 an output stage impedance matching amplifier, added to a rear end of the second variable gain amplifier, and reinforcing an insufficient gain by re-amplifying a two-stage amplified output obtained from the second variable gain amplifier, providing impedance matching between an input terminal and an output terminal of the variable gain amplification device, and enhancing linearity of an output voltage, wherein a variable amplification gain for the input signal is provided over a wide frequency range with a low phase change as a phase difference between the first variable gain amplifier and the second variable gain amplifier is canceled.

13. The wideband variable gain amplification device of claim 12, wherein the first variable gain amplifier includes at least first and second variable gain transistors for controlling an amplification operation through current steering, and the second variable gain amplifier includes at least third and fourth variable gain transistors for controlling an amplification operation through current steering, and wherein the first and third variable gain transistors are configured to receive a common first control bias voltage, and the second and fourth variable gain transistors are configured to receive a common second control bias voltage, so that the first variable gain amplifier and the second variable gain amplifier perform amplification operations to simultaneously produce variable gains by varying at least one of the first control bias voltage and the second control bias voltage.

14. The wideband variable gain amplification device of claim 13, wherein the variable gain obtained by in each of the first variable gain amplifier and the second variable gain amplifier is changed digitally instead of being changed analogously by setting each of the first control bias voltage and the second control bias voltage to any one of a voltage corresponding to ON and a voltage corresponding to OFF.

15. The wideband variable gain amplification device of claim 12, wherein the first variable gain amplifier performs amplification so that a relative phase change amount gradually increases in a negative direction as a variable gain amount of the first output signal becomes larger, and the second variable gain amplifier performs amplification so that a relative phase change amount gradually increases in a positive direction as a variable gain amount of the second output signal becomes larger.

16. A wideband variable gain amplification device, comprising:
a first variable gain amplifier configured to amplify an input signal in a current steering manner to be output with a variable gain amount such that a relative phase change amount gradually increases in any one of a positive direction and a negative direction as a variable gain amount of a first amplified output signal from the first variable gain amplifier becomes larger; and
a second variable gain amplifier configured to have an input terminal connected to an output terminal of the first variable gain amplification unit, further amplify the first amplified output signal received from the first variable gain amplifier in the current steering manner with a variable amplification gain so that a relative phase change amount gradually increases in a direction opposite to a phase change direction by the first variable gain amplifier as a variable gain amount of a second amplified output signal from the second variable gain amplifier becomes larger,
wherein the first variable gain amplifier performs amplification so that a relative phase change amount gradually increases in a negative direction as a variable gain amount of the first output signal becomes larger, and the second variable gain amplifier performs amplification so that a relative phase change amount gradually increases in a positive direction as a variable gain amount of the second output signal becomes larger,
wherein the second variable gain amplifier is configured to include a phase adjustment unit that is configured to adjust a phase change amount of the output signal from the second variable gain amplifier by using a degeneracy inductor such that a relative phase change amount gradually increases in a positive direction as a variable gain amount increases, and
wherein a variable amplification gain for the input signal is provided over a wide frequency range with a low phase change as a phase difference between the first variable gain amplifier and the second variable gain amplifier is canceled.

17. The wideband variable gain amplification device of claim 16, wherein the first variable gain amplifier comprises: a first two-stage variable amplification unit, configured to be a cascade amplifier formed with a first and second transistors, and to multi-stage amplify an input signal of the first variable gain amplifier to be output so that a variable amplification gain is obtained by current steering control; a first input unit configured to provide a bias voltage and an impedance-matched input signal of the first variable gain amplifier to the first transistor located at an input terminal of the first two-stage variable amplification unit; a first bias voltage input unit, connected between Vdd and ground, and configured to provide a bias voltage from which an AC component is removed to the second transistor located at an output terminal of the first two-stage variable amplification unit; a first current steering variable gain amplification unit, connected to a connection node between the first transistor and the second transistor, and configured to vary an amplification gain of the first two-stage amplification unit by current steering; and a first output unit, connected between Vdd and an output terminal of the first two-stage variable amplification unit, and configured to output an output signal amplified by the first two-stage variable amplification unit so as to block a direct current component and ensure impedance matching and gain characteristics, and wherein the second variable gain amplifier comprises: a second two-stage variable amplification unit, including third and fourth transistors coupled to constitute a cascode amplifier, configured to two-state amplify an output signal received from the first variable gain amplifier such that a variable amplification gain is obtained by current steering; a second input unit configured to provide a bias voltage and an impedance matched input signal of the second variable gain amplifier to the third transistor located at an input terminal of the second two-stage variable amplification unit; a second bias voltage input unit, connected between Vdd and ground, and configured to provide a bias voltage from which an alternating current component is removed to the fourth transistor located at an output terminal of the second two-stage variable amplification unit; a second current steering variable gain amplification unit, connected to a connection node between the first transistor and the second transistor, and configured to vary an amplification gain of the second two-stage amplification unit by current steering; a second output unit, connected between Vdd and an output terminal of the second two-stage variable amplification unit, and configured to output an output signal amplified by the second two-stage variable amplification unit such that a direct component is blocked and impedance matching and gain characteristic are ensured; and a phase adjustment unit configured to adjust a phase change amount of the output signal of the second variable gain amplifier using a degeneracy inductor so that a relative phase change amount gradually increases in a positive direction as a variable gain amount of the second two-stage variable amplification unit increases.

18. The wideband variable gain amplification device of claim 17, wherein the second two-stage variable amplification unit comprises a fifth field effect transistor functioning as a common-source amplifier; and a sixth field effect transistor functioning as a common-gate amplifier and coupled with the fifth field effect transistor to form a cascode amplifier, wherein the second input unit comprises a fourth capacitor, connected to an input terminal of the second variable gain amplifier, and blocking a direct current component included in an input signal applied to the second two-stage variable amplification unit; sixth and seventh inductors, coupled between an output terminal of the first variable gain amplifier and the ground and between the fourth capacitor and a gate of the fifth field effect transistor, respectively, and providing conjugate input/output impedance matching; and a fifth resistor connected between ground and a connection node of the seventh inductor and a gate of the fifth field effect transistor, and supplying a gate bias voltage to the fifth field effect transistor, wherein the second bias voltage input unit comprises a sixth resistor connected between Vdd and a common gate of the sixth field effect transistor and supplying a gate bias voltage; and a fifth capacitor, connected between ground and a connection node of the sixth resistor and a common gate of the sixth field effect transistor, and shorting an alternating current component included in the gate bias voltage for the sixth field effect transistor to ground, wherein the second current steering variable gain amplification unit comprises a seventh resistor, coupled to a first bias control voltage, for a digital control bias input; an eighth resistor, coupled to a second bias control voltage, for a digital control bias input; a seventh field effect transistor having a source connected to a source of the sixth field effect transistor and a gate connected to the seventh resistor; and an eighth field effect transistor having a source connected to a source of the fifth field effect transistor and a gate connected to the eighth resistor, wherein the second output unit comprises ninth and tenth inductors, connected in series between Vdd and a drain of the sixth field effect transistor, which is an output terminal of the second two-stage variable amplification unit, and securing impedance matching and gain characteristics; and a sixth capacitor, connected between a connection node of the ninth inductor and the tenth inductor and an output terminal of the second variable gain amplifier, and blocking a direct current component, and wherein the phase adjustment unit comprises a degeneracy inductor for adjusting a phase change amount of an output signal of the second variable gain amplifier; and a seventh capacitor for blocking direct current shorting caused by the degeneracy inductor.

19. The wideband variable gain amplification device of claim 16, further comprising an input stage impedance matching amplifier, added to a front end of the first variable gain amplifier, and reinforcing an insufficient gain by pre-amplifying an input of the first variable gain amplifier and providing impedance matching between an input terminal and an output terminal of the variable gain amplification device.

20. The wideband variable gain amplification device of claim 16, further comprising an output stage impedance matching amplifier, added to a rear end of the second variable gain amplifier, and reinforcing an insufficient gain by re-amplifying a two-stage amplified output obtained from the second variable gain amplifier, providing impedance matching between an input terminal and an output terminal of the variable gain amplification device, and enhancing linearity of an output voltage.

* * * * *